United States Patent
Kanazawa et al.

(10) Patent No.: US 11,186,769 B2
(45) Date of Patent: Nov. 30, 2021

(54) WAVELENGTH CONVERSION LUMINESCENT RESIN COMPOSITION, METHOD FOR PRODUCING WAVELENGTH CONVERSION LUMINESCENT RESIN COMPOSITION, WAVELENGTH CONVERSION MEMBER, AND LIGHT-EMITTING ELEMENT

(71) Applicant: FUJIFILM Corporation, Tokyo (JP)

(72) Inventors: Yoshinori Kanazawa, Ashigarakami-gun (JP); Kousuke Watanabe, Ashigarakami-gun (JP); Kouitsu Sasaki, Ashigarakami-gun (JP); Kazuhei Kaneko, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 233 days.

(21) Appl. No.: 16/442,612

(22) Filed: Jun. 17, 2019

(65) Prior Publication Data
US 2019/0300782 A1   Oct. 3, 2019

Related U.S. Application Data

(63) Continuation of application No. PCT/JP2017/045447, filed on Dec. 19, 2017.

(30) Foreign Application Priority Data

Dec. 19, 2016 (JP) .............................. JP2016-245317
Jan. 30, 2017 (JP) .............................. JP2017-014281

(51) Int. Cl.
| | |
|---|---|
| *C09K 11/06* | (2006.01) |
| *C09K 11/02* | (2006.01) |
| *H01L 33/50* | (2010.01) |
| *C08K 5/55* | (2006.01) |
| *H05B 33/14* | (2006.01) |
| *H01L 51/50* | (2006.01) |
| *C08L 101/00* | (2006.01) |
| *G02B 5/20* | (2006.01) |
| *H05B 33/12* | (2006.01) |

(52) U.S. Cl.
CPC ............... *C09K 11/06* (2013.01); *C08K 5/55* (2013.01); *C08L 101/00* (2013.01); *C09K 11/02* (2013.01); *G02B 5/20* (2013.01); *H01L 33/50* (2013.01); *H01L 33/502* (2013.01); *H01L 51/50* (2013.01); *H05B 33/12* (2013.01); *H05B 33/14* (2013.01); *C09K 2211/1018* (2013.01); *C09K 2211/1022* (2013.01)

(58) Field of Classification Search
CPC . C09K 11/02; C09K 11/06; C09K 2211/1018; C09K 2211/1022; C08K 5/55
See application file for complete search history.

(56) References Cited

U.S. PATENT DOCUMENTS

| | | | |
|---|---|---|---|
| 2011/0054187 A1 | 3/2011 | Rurack et al. | |
| 2016/0271273 A1 | 9/2016 | Sakurai et al. | |
| 2016/0312113 A1 | 10/2016 | Murakami et al. | |
| 2019/0016953 A1* | 1/2019 | Prete ................... | C08K 5/0091 |
| 2019/0185745 A1* | 6/2019 | Watanabe ............. | C07F 5/02 |

FOREIGN PATENT DOCUMENTS

| | | |
|---|---|---|
| CN | 105602277 A | 5/2016 |
| CN | 105874033 A | 8/2016 |
| GN | 103232483 A | 8/2013 |
| JP | 2007-238489 A | 9/2007 |
| JP | 2011-241160 A | 12/2011 |
| JP | 2016-6033 A | 1/2016 |
| JP | 2016-44227 A | 4/2016 |
| WO | 2010/098119 A1 | 9/2010 |
| WO | 2015/056779 A1 | 4/2015 |

(Continued)

OTHER PUBLICATIONS

Office Action dated Jul. 28, 2020, from the Korean Intellectual Property Office in Korean Application No. Machine 10-2019-7017522.
Office Action dated Nov. 23, 2020 from the China National Intellectual Property Administration in CN Partial Application No. 201780078342.7.

(Continued)

*Primary Examiner* — C Melissa Koslow
(74) *Attorney, Agent, or Firm* — Sughrue Mion, PLLC

(57) ABSTRACT

An object of the present invention is to provide a wavelength conversion luminescent resin composition that exhibits a high quantum yield, a wavelength conversion member, and a light-emitting element; as well as a method for producing the wavelength conversion luminescent resin composition that exhibits a high quantum yield. The present invention provides a wavelength conversion luminescent resin composition that contains at least one compound represented by Formula (1) and a resin.

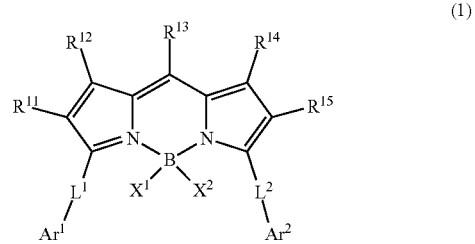

(1)

The substituents in the formula are as defined in the present specification.

12 Claims, No Drawings

(56) References Cited

FOREIGN PATENT DOCUMENTS

WO       2016/132597 A1       8/2016
WO    WO 2017/118830     *    7/2017

OTHER PUBLICATIONS

International Preliminary Report on Patentability dated Apr. 30, 2019 from the International Bureau in counterpart International Application No. PCT/JP2017/045447.
International Search Report dated Mar. 27, 2018 from the International Searching Authority in counterpart International Application No. PCT/JP2017/045447.
Written Opinion dated Mar. 27, 2018 from the International Bureau in counterpart International Application No. PCT/JP2017/045447.
Ziessel, Raymond et al., "Quasi-One-Dimensional Electronic Systems Formed from Boron Dipyrromethene (BODIPY) Dyes", Chemistry A European Journal, 2010, vol. 16, pp. 11942-11953.
Hecht, Mandy et al., "Fluorinated Boron-Dipyrromethene (BODIPY) Dyes: Bright and Versatile Probes for Surface Analysis", Chemistry Open, 2013, vol. 2, pp. 25-38.
Galangau, Olivier et al., "Rational design of visible and NIR distyryl-BODIPY dyes from a novel fluorinated platform", Organic & Biomolecular Chemistry, 2010, vol. 8, pp. 4546-4553.
Hiruta, Yuki et al., "Near IR Emitting Red-Shifting Ratiometric Fluorophores Based on Borondipyrromethene", Organic Letters, 2015, vol. 17, pp. 3022-3025.

* cited by examiner

WAVELENGTH CONVERSION LUMINESCENT RESIN COMPOSITION, METHOD FOR PRODUCING WAVELENGTH CONVERSION LUMINESCENT RESIN COMPOSITION, WAVELENGTH CONVERSION MEMBER, AND LIGHT-EMITTING ELEMENT

CROSS-REFERENCE TO RELATED APPLICATIONS

This application is a Continuation of PCT International Application No. PCT/JP2017/045447 filed on Dec. 19, 2017, which claims priority under 35 U.S.C § 119(a) to Japanese Patent Application No. 2016-245317 filed on Dec. 19, 2016 and Japanese Patent Application No. 2017-014281 filed on Jan. 30, 2017. Each of the above application(s) is hereby expressly incorporated by reference, in its entirety, into the present application.

BACKGROUND OF THE INVENTION

1. Field of the Invention

The present invention relates to a wavelength conversion luminescent resin composition containing a compound having a specific structure. The present invention further relates to a wavelength conversion member including a wavelength conversion luminescent resin composition, a light-emitting element, and a method for producing a wavelength conversion luminescent resin composition.

2. Description of the Related Art

Currently, an incandescent bulb, a fluorescent lamp, a light emitting diode (LED), electroluminescence, and the like are used as a light-emitting element. For example, light generated from an incandescent bulb and a fluorescent lamp is light by heat or discharge, and there is a fundamental problem that the life of a heat source or discharge source is short, so that the life of the incandescent bulb or fluorescent lamp as the light-emitting element is limited. On the other hand, the light radiation of a light emitting diode (LED) is luminescence due to inherent properties of a semiconductor, and LED is expected to achieve a longer life. As described above, various methods are used as the light emission method, and the characteristic improvement thereof is still being continued now.

It is known that light emitted from a light-emitting element is dimmed by a wavelength conversion material (also referred to as a color conversion material) containing an organic coloring agent. Such a wavelength conversion material is used for lighting applications and display applications. A light source for lighting is particularly required to have properties of how to resemble natural light, such as color rendering properties. In addition, a light source for display is required to have color reproducibility.

As the color conversion material as described above, for example, JP2011-241160A discloses a color conversion material including a pyrromethene boron complex compound. In addition, WO2015/056779A discloses a resin composition containing a near infrared fluorescent coloring agent such as pyrromethene boron complex and a resin.

SUMMARY OF THE INVENTION

The color conversion material disclosed in JP2011-241160A has a problem that the quantum yield decreases due to aggregation, resulting from the structure of the pyrromethene boron complex compound to be used. The resin composition disclosed in WO2015/056779A has a problem that the wavelength conversion material is insufficient in luminance with long wave light emission and low in quantum yield.

An object of the present invention is to provide a wavelength conversion luminescent resin composition which exhibits a high quantum yield, a wavelength conversion member, and a light-emitting element. Another object of the present invention is to provide a method for producing the wavelength conversion luminescent resin composition which exhibits a high quantum yield.

As a result of extensive studies to achieve the foregoing objects, the present inventors have found that it is possible to produce a wavelength conversion luminescent resin composition exhibiting a high quantum yield by producing a wavelength conversion luminescent resin composition using a compound having a specific structure and a resin. The present invention has been completed based on these findings.

That is, according to the present invention, the following inventions are provided.

[1] A wavelength conversion luminescent resin composition, comprising:
at least one compound represented by Formula (1); and
a resin,

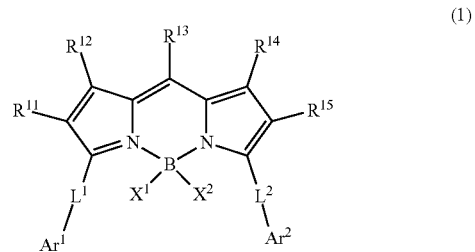

(1)

in the formula, $R^{11}$ to $R^{15}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least three of $R^{11}$, . . . , or $R^{15}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1),

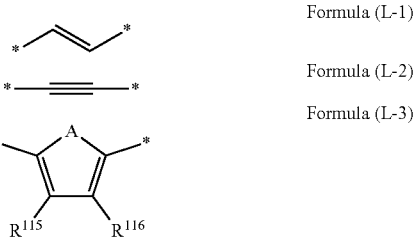

Formula (L-1)

Formula (L-2)

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—,

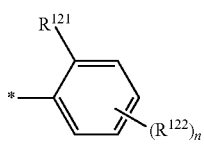

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

[2] The wavelength conversion luminescent resin composition according to [1], in which $L^1$ and $L^2$ are each independently a substituent represented by Formula (L-1) or Formula (L-2).

[3] The wavelength conversion luminescent resin composition according to [1] or [2], in which $R^{13}$ is a substituent represented by Formula (Ar-1),

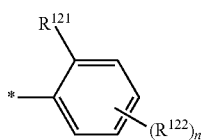

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

[4] The wavelength conversion luminescent resin composition according to any one of [1] to [3], in which $Ar^1$, $Ar^2$, and $R^{13}$ are each independently a substituent represented by Formula (Ar-2),

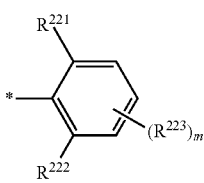

Formula (Ar-2)

in the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

[5] The wavelength conversion luminescent resin composition according to any one of [1] to [4], in which $R^{11}$ and $R^{15}$ are each independently a substituent represented by Formula (Ar-1),

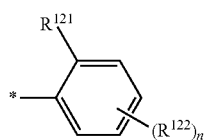

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

[6] A wavelength conversion member comprising the wavelength conversion luminescent resin composition according to any one of [1] to [5].

[7] A light-emitting element comprising the wavelength conversion member according to [6].

[8] A method for producing a wavelength conversion luminescent resin composition, comprising:
a step of drying a solution containing at least one compound represented by Formula (1) and a resin in a solvent,

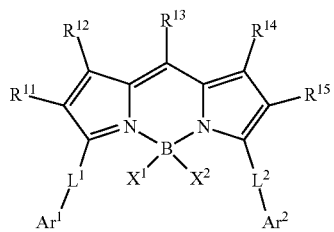

(1)

in the formula, $R^{11}$ to $R^{15}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least three of $R^{11}$, ..., or $R^{15}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1),

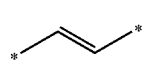

Formula (L-1)

Formula (L-2)

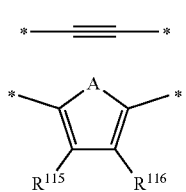

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—, Formula (Ar-1)

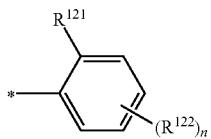

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

[9] A method for producing a wavelength conversion luminescent resin composition, comprising:
a step of curing a composition containing at least one compound represented by Formula (1) and a monomer and/or a polymerization precursor, (1)

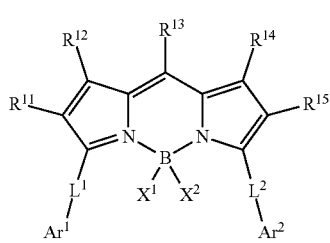

in the formula, $R^{11}$ to $R^{15}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least three of $R^1, \ldots,$ or $R^{15}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1), Formula (L-1)

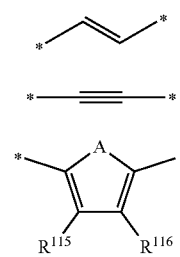

Formula (L-2)

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—, Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

[10] A method for producing a wavelength conversion luminescent resin composition, comprising:
a step of melting a composition containing at least one compound represented by Formula (1) and a resin, (1)

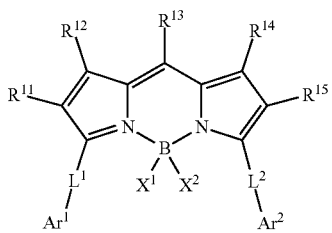

in the formula, $R^{11}$ to $R^{15}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least three of $R^{11}, \ldots,$ or $R^{15}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1),

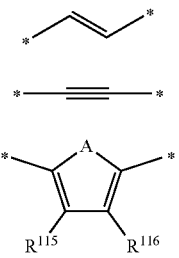

Formula (L-1)

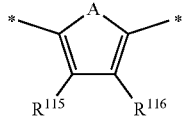

Formula (L-2)

Formula (L-3)

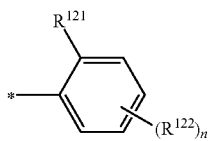

in the formulae, $R^{15}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—, Formula (Ar-1)

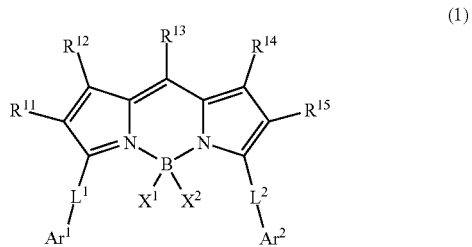

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

The wavelength conversion luminescent resin composition and the wavelength conversion member of the present invention can realize a high quantum yield by including a pyrromethene boron complex having a specific structure.

DESCRIPTION OF THE PREFERRED EMBODIMENTS

Hereinafter, embodiments of the present invention will be described in detail.

In the present specification, the numerical range indicated by using the indication "to" means a range including numerical values described before and after "to" as a minimum value and a maximum value, respectively.

According to the wavelength conversion luminescent resin composition according to the embodiment of the present invention, a wavelength conversion material with high quantum yield and high luminous efficiency can be prepared since a compound having a specific structure is used in the composition. The compound represented by Formula (1) used in the present invention enables long-wavelength luminescence by introducing a conjugated substituent. Further, aggregation of the compound can be prevented by including a substituent at the ortho position of the aromatic ring of the above-mentioned conjugated substituent in the compound represented by Formula (1), and therefore the decrease in quantum yield due to aggregation can be suppressed.

[Wavelength Conversion Luminescent Resin Composition]

The wavelength conversion luminescent resin composition according to the embodiment of the present invention is a wavelength conversion luminescent resin composition containing at least one compound represented by Formula (1) and a resin.

The meaning of each symbol in Formula (1) is as defined in the present specification.

<Compound represented by Formula (1)>

In the present specification, the alkyl group may be any of linear, branched, cyclic, or a combination thereof, and the number of carbon atoms in the linear or branched alkyl group is preferably 1 to 36, more preferably 1 to 18, still more preferably 1 to 12, and particularly preferably 1 to 6. Examples of the cyclic alkyl group include a cycloalkyl group having 3 to 8 carbon atoms. Specific examples of the alkyl group include a methyl group, an ethyl group, an n-propyl group, an isopropyl group, an n-butyl group, an iso-butyl group, a sec-butyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, and a cyclohexyl group.

In the present specification, the aryl group is preferably an aryl group having 6 to 48 carbon atoms, more preferably an aryl group having 6 to 24 carbon atoms, and still more preferably an aryl group having 6 to 14 carbon atoms, examples of which include a phenyl group, a naphthyl group, an anthryl group, a pyrenyl group, a phenanthrenyl group, a biphenyl group, and a fluorenyl group.

In the present specification, the heterocyclic group may be preferably a 5- to 7-membered substituted or unsubstituted, saturated or unsaturated, aromatic or non-aromatic, monocyclic or fused heterocyclic group. The heterocyclic group is more preferably a heterocyclic group in which the ring-constituting atom is selected from a carbon atom, a nitrogen atom, an oxygen atom, and a sulfur atom and which has at least one hetero atom of a nitrogen atom, an oxygen atom, or a sulfur atom, and still more preferably a 5- or 6-membered aromatic heterocyclic group having 3 to 30 carbon atoms. Examples of the heterocyclic group include a furyl group, a benzofuryl group, a dibenzofuryl group, a thienyl group, a benzothienyl group, a dibenzothienyl group, a pyridyl group, a pyrimidinyl group, a quinolyl group, an isoquinolyl group, an acridinyl group, a phenanthridinyl group, a pteridinyl group, a pyrazinyl group, a quinoxalinyl group, a pyrimidinyl group, a quinazolyl group, a pyridazinyl group, a cinnolinyl group, a phthalazinyl group, a triazinyl group, an oxazolyl group, a benzoxazolyl group, a thiazolyl group, a benzothiazolyl group, an imidazolyl group, a benzimidazolyl group, a pyrazolyl group, an indazolyl group, an isoxazolyl group, a benzisoxazolyl group, an isothiazolyl group, a benzisothiazolyl group, an oxadiazolyl group, a thiadiazolyl group, a triazolyl group, a tetrazolyl group, a furyl group, a thienyl group, a pyrrolyl group, an indolyl group, an imidazopyridinyl group, and a carbazolyl group.

In the present specification, the silyl group is preferably a substituted or unsubstituted silyl group having 0 to 30 carbon atoms, examples of which include a trimethylsilyl group, a t-butyldimethylsilyl group, and a phenyldimethylsilyl group.

In the present specification, the acyl group is preferably a linear or branched alkanoyl group having 2 to 15 carbon atoms, examples of which include an acetyl group, a propionyl group, a butyryl group, an isobutyryl group, a valeryl group, an isovaleryl group, a pivaloyl group, a hexanoyl group, a heptanoyl group, and a benzoyl group.

In the present specification, the alkoxy group is preferably an alkoxy group having 1 to 20 carbon atoms, examples of which include a methoxy group, an ethoxy group, a propoxy group, an n-butoxy group, a pentyloxy group, a hexyloxy group, and a heptyloxy group.

In the present specification, the aryloxy group is preferably an aryloxy group having 6 to 14 carbon atoms, examples of which include a phenoxy group, a naphthoxy group, and an anthryloxy group.

The alkylthio group is preferably an alkylthio group having 1 to 30 carbon atoms, examples of which include a methylthio group, an ethylthio group, and an n-hexadecylthio group.

The arylthio group is preferably an arylthio group having 6 to 30 carbon atoms, examples of which include a phenylthio group, a p-chlorophenylthio group, and an m-methoxyphenylthio group.

In the present specification, examples of the halogen atoms include a fluorine atom, a chlorine atom, a bromine atom, and an iodine atom.

In the present specification, the aromatic ring may be, for example, an aromatic hydrocarbon ring such as a benzene ring, a naphthalene ring, an anthracene ring, a phenanthrene ring, a pyrene ring, a perylene ring, or a terylene ring; an aromatic heterocyclic ring such as an indene ring, an azulene ring, a pyridine ring, a pyrazine ring, a pyrimidine ring, a pyrazole ring, a pyrazolidine ring, a thiazolidine ring, an oxazolidine ring, a pyran ring, a chromene ring, a pyrrole ring, a pyrrolidine ring, a benzimidazole ring, an imidazoline ring, an imidazolidine ring, an imidazole ring, a triazole ring, a triazine ring, a diazole ring, an indoline ring, a thiophene ring, a thienothiophene ring, a furan ring, an oxazole ring, an oxadiazole ring, a thiazine ring, a thiazole ring, an indole ring, a benzothiazole ring, a benzothiadiazole ring, a naphthothiazole ring, a benzoxazole ring, a naphthoxazole ring, an indolenine ring, a benzindolenine ring, a quinoline ring, or a quinazoline ring; and a fused aromatic ring such as a fluorene ring or a carbazole ring. Aromatic rings having 5 to 16 carbon atoms (an aromatic ring and a fused ring containing an aromatic ring) are preferable.

Incidentally, the aromatic ring may have a substituent, and the term "aromatic ring" means both an aromatic ring having a substituent and an aromatic ring having no substituent. The substituent of the aromatic ring may be, for example, the substituent described in Substituent group A which will be described later.

In the present specification, examples of the amino group include an amino group; an alkyl-substituted amino group such as a mono- or dimethylamino group, a mono- or diethylamino group, or a mono- or di(n-propyl)amino group; an amino group substituted with an aromatic residue, such as a mono- or diphenylamino group or a mono- or dinaphthylamino group; an amino group substituted with one alkyl group and one aromatic residue, such as a monoalkylmonophenylamino group; a benzylamino group, an acetylamino group, and a phenylacetylamino group. Here, the aromatic residue means a group obtained by removing one hydrogen atom from an aromatic ring, and the aromatic ring is as described hereinabove.

In a case where $R^{11}$ to $R^{15}$ each represent an alkyl group, an aryl group, a heterocyclic group, an ethenyl group, an ethynyl group, an amino group, a silyl group, an acyl group, an alkoxy group, an aryloxy group, an alkylthio group, or an arylthio group, each of these groups may have a substituent, examples of which include the substituents described in Substituent group A shown below.

Substituent group A: a sulfamoyl group, a cyano group, an isocyano group, a thiocyanato group, an isothiocyanato group, a nitro group, a nitrosyl group, a halogen atom (a fluorine atom, a chlorine atom, a bromine atom, or an iodine atom), a hydroxy group, an amino group, a mercapto group, an amide group, an alkoxy group, an aryloxy group, an alkylthio group, an arylthio group, a carbamoyl group, an acyl group, an aldehyde group, a carbonyl group, an aryl group, an alkyl group, an alkyl group substituted with a halogen atom, an alkenyl group (for example, an ethenyl group), an alkynyl group (for example, an ethynyl group), a silyl group, and a trialkylsilyl group (for example, a trimethylsilyl group).

In a case where $X^1$ and $X^2$ each represent an alkyl group, an aryl group, a heterocyclic group, a hydroxy group, an alkoxy group, an aryloxy group, an alkylthio group, an arylthio group, an ethenyl group, or an ethynyl group, each of these groups may have a substituent, examples of which include the substituents described in Substituent group A.

In a case where $R^{115}$ and $R^{116}$ each represent an alkyl group, an aryl group, a heterocyclic group, an ethenyl group, an ethynyl group, an amino group, a silyl group, an acyl group, an alkoxy group, an aryloxy group, an alkylthio group, or an arylthio group, each of these groups may have a substituent, examples of which include the substituents described in Substituent group A.

In a case where $R^{121}$ and $R^{122}$ each represent an alkyl group, an amino group, a silyl group, an acyl group, an alkoxy group, an aryloxy group, an alkylthio group, or an arylthio group, each of these groups may have a substituent, examples of which include the substituents described in Substituent group A.

In a case where $R^{221}$, $R^{222}$, and $R^{223}$ each represent an alkyl group, an amino group, a silyl group, an acyl group, an alkoxy group, an aryloxy group, an alkylthio group, or an arylthio group, each of these groups may have a substituent, examples of which include the substituents described in Substituent group A.

In Formula (1), $R^{11}$ to $R^{15}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent. At least three of $R^{11}$, . . . , or $R^{15}$ represent atoms or groups other than hydrogen atoms, preferably at least four of $R^{11}$, . . . , $R^{15}$ represent atoms or groups other than hydrogen atoms, and more preferably all of $R^{11}$ to $R^{15}$ represent atoms or groups other than hydrogen atoms.

$R^{11}$ and $R^{15}$ may be the same or different atoms or groups, but $R^{11}$ and $R^{15}$ are preferably the same atoms or groups. $R^{12}$ and $R^{14}$ may be the same or different atoms or groups, but $R^{12}$ and $R^{14}$ are preferably the same atoms or groups.

$R^{11}$ and $R^{15}$ preferably each independently represent a hydrogen atom, a halogen atom, an alkyl group, an aryl group, a heterocyclic group, an ethenyl group, or an ethynyl group, more preferably each independently represent a hydrogen atom, an alkyl group, an aryl group, or an ethynyl group, still more preferably each independently represent a hydrogen atom, an alkyl group, or an aryl group, and particularly preferably each independently represent an aryl group, each of which may have a substituent.

$R^{11}$ and $R^{15}$ are each independently most preferably a substituent represented by Formula (Ar-1).

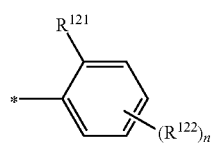

Formula (Ar-1)

In the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; n represents an integer of 0 to 4, and in a case where n is 2 or more, a plurality of $R^{122}$'s may be the same as or different from one another.

$R^{121}$ and $R^{122}$ preferably each independently represent a halogen atom, an alkyl group, an amino group, a silyl group, an acyl group, an alkoxy group, or an aryloxy group, more preferably each independently represent a halogen atom, an alkyl group, a silyl group, or an alkoxy group, still more preferably each independently represent an alkyl group or an alkoxy group, and particularly preferably each independently represent an alkyl group.

$R^{12}$ and $R^{14}$ preferably each independently represent a hydrogen atom, a halogen atom, an alkyl group, an aryl group, an alkoxy group, an aryloxy group, an alkylthio group, or an arylthio group, more preferably each independently represent a hydrogen atom, an alkyl group, an aryl group, an alkoxy group, an aryloxy group, an alkylthio group, or an arylthio group, more preferably each independently represent a hydrogen atom, an alkyl group, or an aryl group, particularly preferably each independently represent a hydrogen atom or an alkyl group, and most preferably each independently represent an alkyl group, each of which may have a substituent.

$R^{13}$ preferably each independently represents a hydrogen atom, an alkyl group, or an aryl group, more preferably each independently represents a hydrogen atom or an alkyl group, and still more preferably each independently represents an aryl group, each of which may have a substituent.

However, it is preferred that $R^{13}$ is a group or atom other than a perfluoroaryl group (a perfluorophenyl group, or the like).

$R^{13}$ is particularly preferably a substituent represented by Formula (Ar-1).

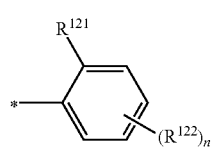

Formula (Ar-1)

In the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; n represents an integer of 0 to 4, and in a case where n is 2 or more, a plurality of $R^{122}$'s may be the same as or different from one another.

$R^{121}$ and $R^{122}$ preferably each independently represent a halogen atom, an alkyl group, an amino group, a silyl group, an acyl group, an alkoxy group, or an aryloxy group, more preferably each independently represent a halogen atom, an alkyl group, a silyl group, or an alkoxy group, still more preferably each independently represent an alkyl group or an alkoxy group, and particularly preferably each independently represent an alkyl group.

$R^{13}$ is most preferably a substituent represented by Formula (Ar-2).

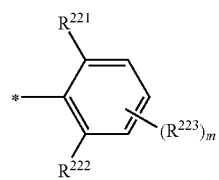

Formula (Ar-2)

In the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

$R^{221}$, $R^{222}$, and $R^{223}$ preferably each independently represent a halogen atom, an alkyl group, an amino group, a silyl group, an acyl group, an alkoxy group, or an aryloxy group, more preferably each independently represent a halogen atom, an alkyl group, a silyl group, or an alkoxy group, still more preferably each independently represent an alkyl group or an alkoxy group, and particularly preferably each independently represent an alkyl group.

In Formula (1), $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring.

$X^1$ and $X^2$ preferably each represent a halogen atom or an alkoxy group, and more preferably a halogen atom.

In Formula (1), $L^1$ and $L^2$ each independently represent any one of Formula (L-1), Formula (L-2), or Formula (L-3).

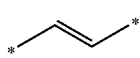

Formula (L-1)

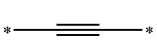

Formula (L-2)

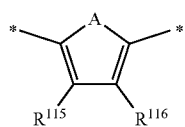

Formula (L-3)

In the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—.

$L^1$ and $L^2$ are each independently preferably a substituent represented by Formula (L-1) or Formula (L-2) and more preferably a substituent represented by Formula (L-1).

$R^{115}$ and $R^{116}$ are each preferably a hydrogen atom.

In Formula (1), $Ar^1$ and $Ar^2$ each independently represent Formula (Ar-1).

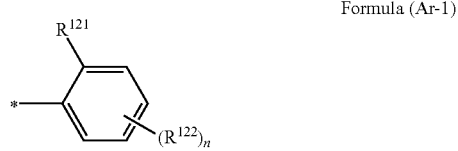

Formula (Ar-1)

In the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; n represents an integer of 0 to 4, and in a case where n is 2 or more, a plurality of $R^{122}$'s may be the same as or different from one another.

$R^{121}$ and $R^{122}$ preferably each independently represent a halogen atom, an alkyl group, an amino group, a silyl group, an acyl group, an alkoxy group, or an aryloxy group, more preferably each independently represent a halogen atom, an alkyl group, a silyl group, or an alkoxy group, still more preferably each independently represent a halogen atom, an alkyl group, or an alkoxy group, and particularly preferably each independently represent an alkyl group.

Most preferably, $Ar^1$ and $Ar^2$ are each independently a substituent represented by Formula (Ar-2).

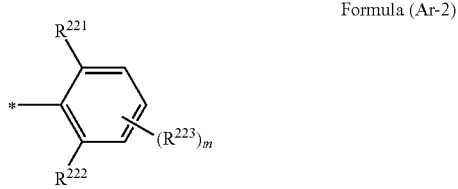

Formula (Ar-2)

In the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

$R^{221}$, $R^{222}$, and $R^{223}$ preferably each independently represent a halogen atom, an alkyl group, an amino group, a silyl group, an acyl group, an alkoxy group, or an aryloxy group, more preferably each independently represent a halogen atom, an alkyl group, a silyl group, or an alkoxy group, still more preferably each independently represent a halogen atom, an alkyl group, or an alkoxy group, and particularly preferably each independently represent an alkyl group.

In the resin composition of the present invention, the compound represented by Formula (1) may be used alone, or a plurality of types of compounds represented by Formula (1) may be used in combination.

Specific Example of Compound Represented by Formula (1)

Specific examples of the compound represented by Formula (1) are described below. Me represents a methyl group, $^t$Bu represents a tert-butyl group, and Ph represents a phenyl group.

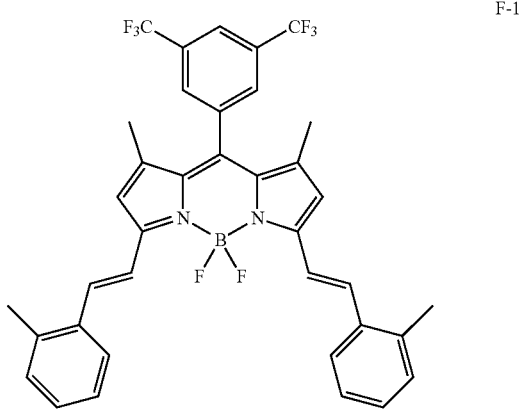

F-1

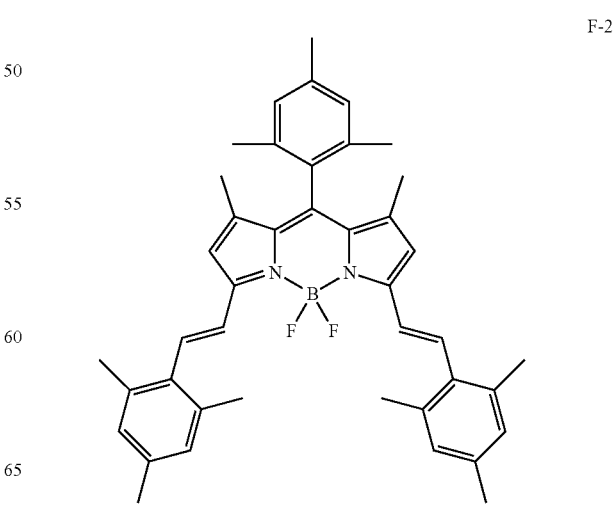

F-2

-continued
F-3
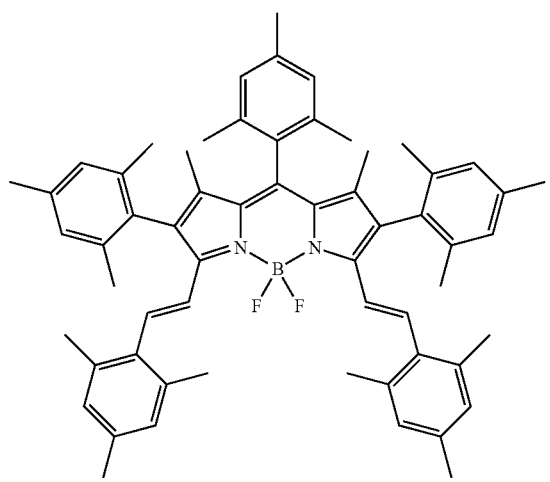
F-4
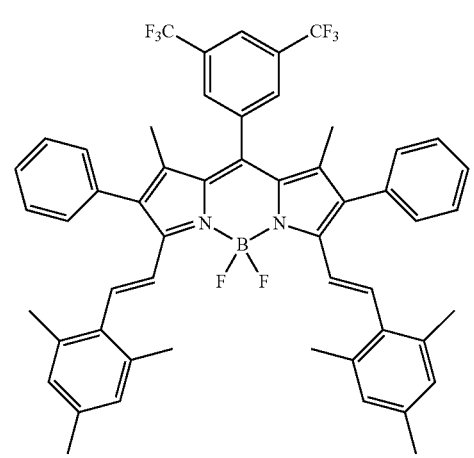
F-6
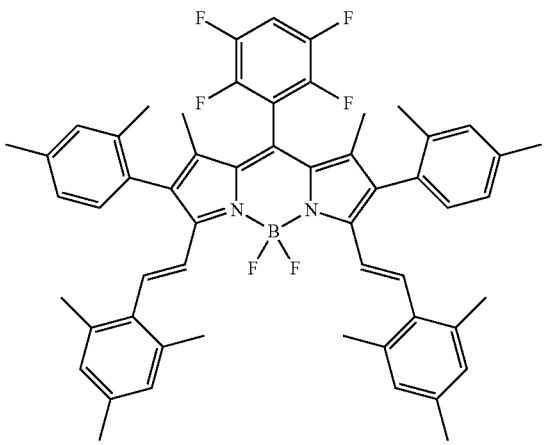
F-7
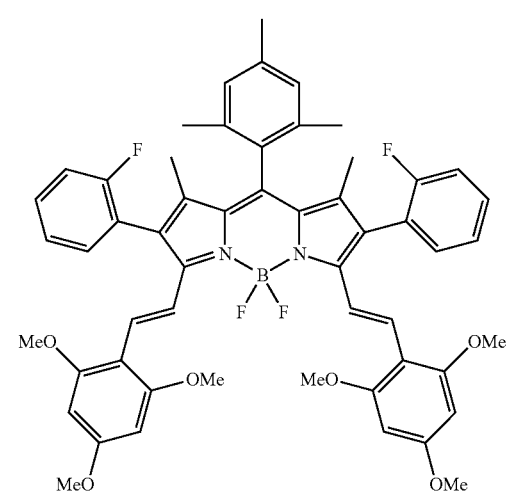
F-5
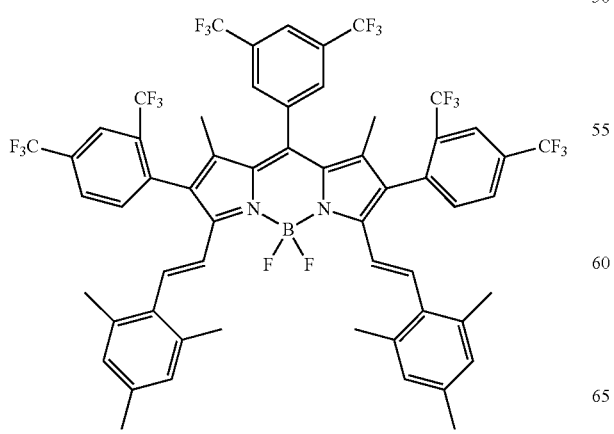
F-8
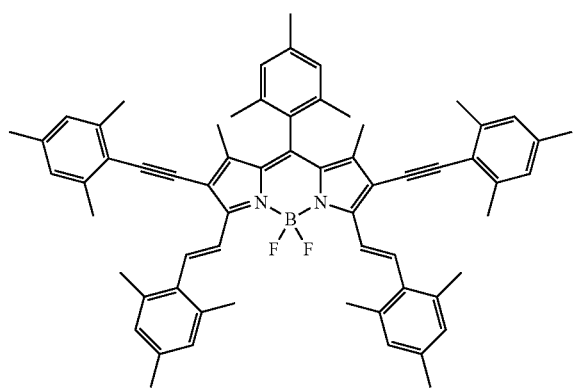

-continued
F-9
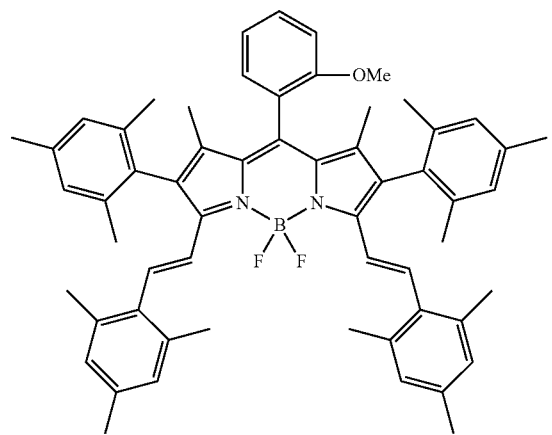
F-10
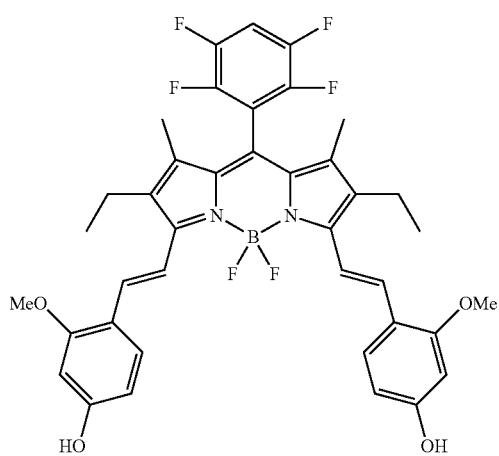
F-11
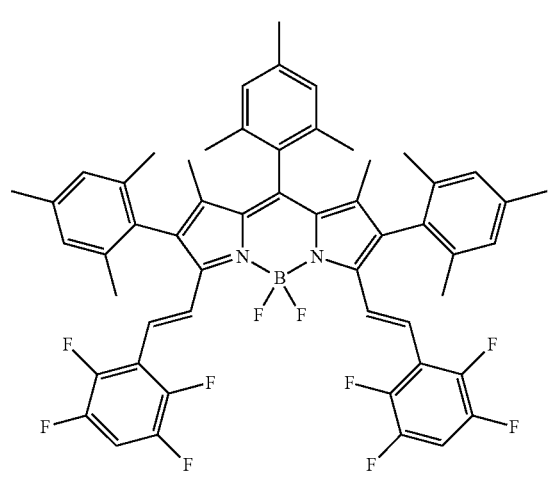
-continued
F-12
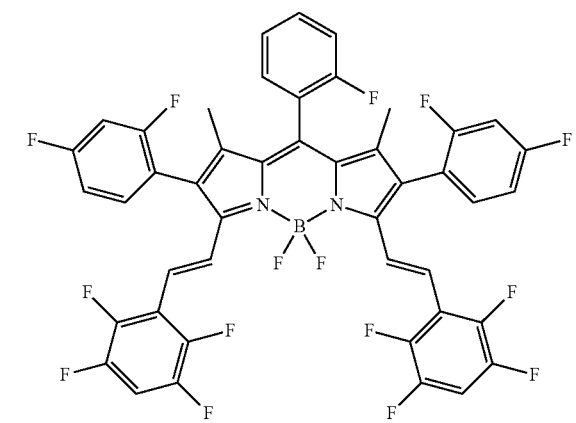
F-13
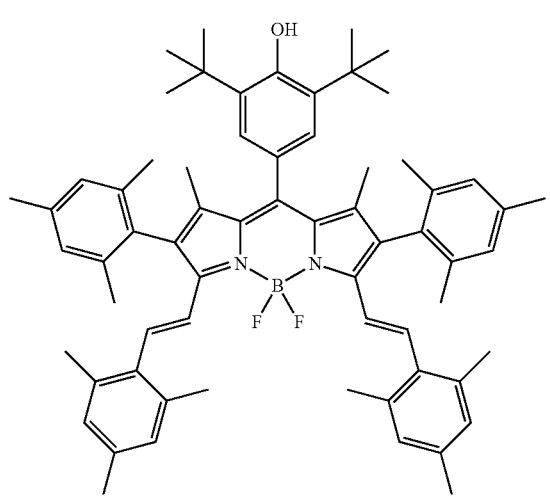
F-14
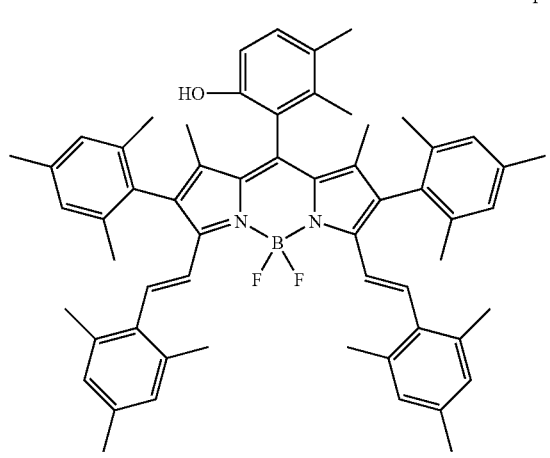

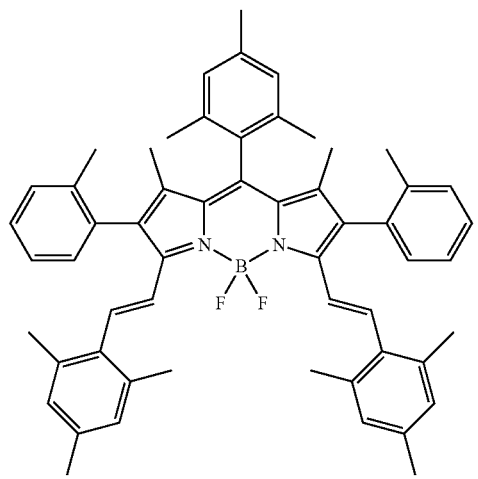
F-15
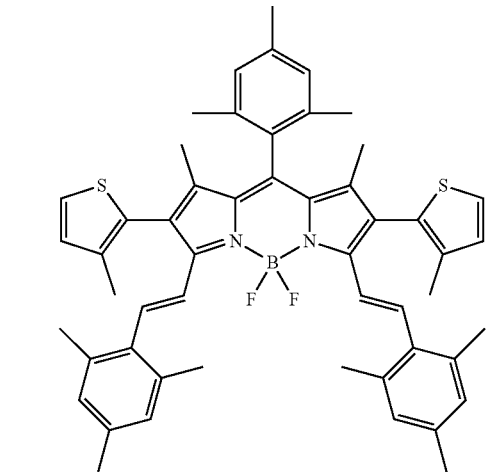
F-18
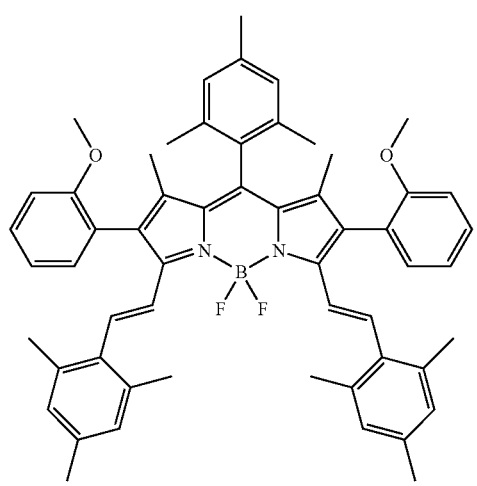
F-16
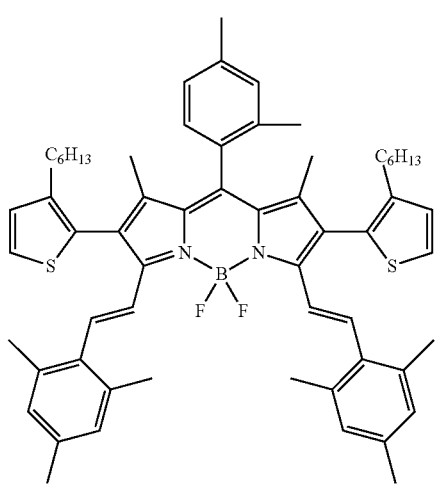
F-19
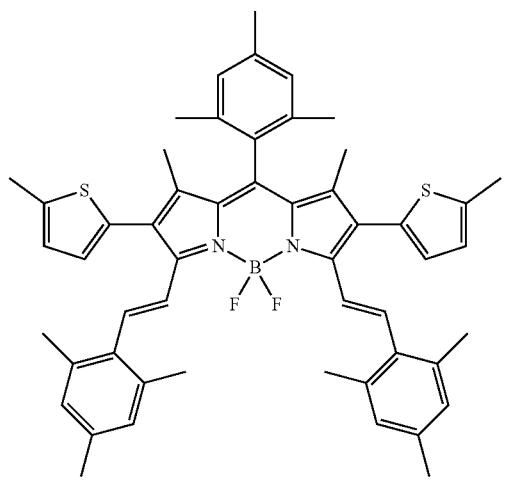
F-17
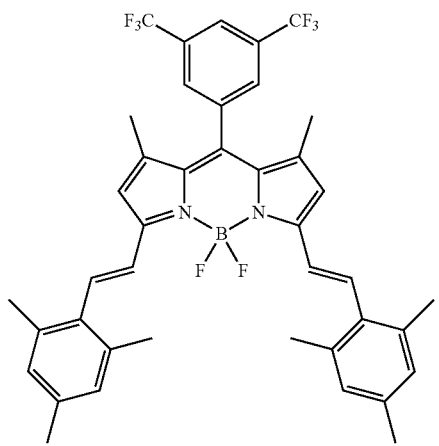
F-20

F-21
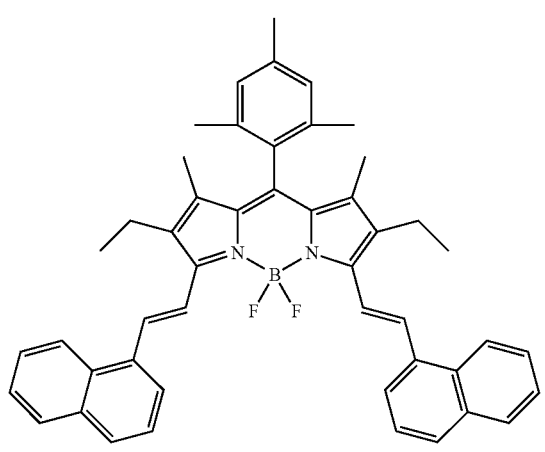
F-22
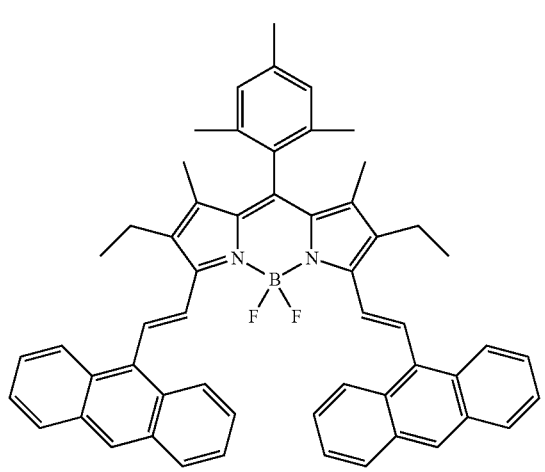
F-23
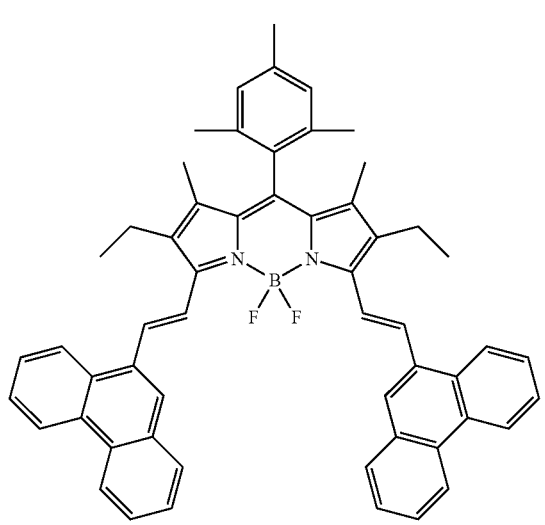
F-24
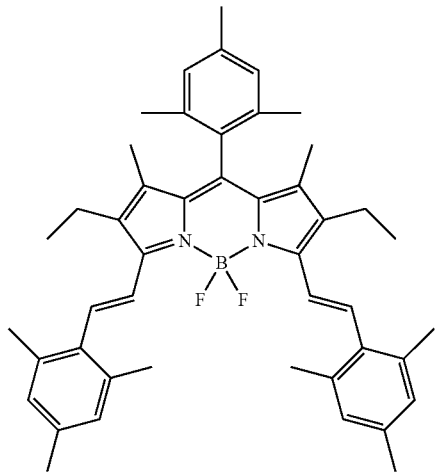
F-25
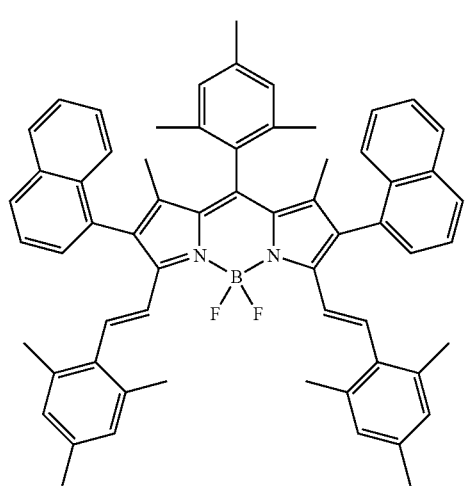
F-26
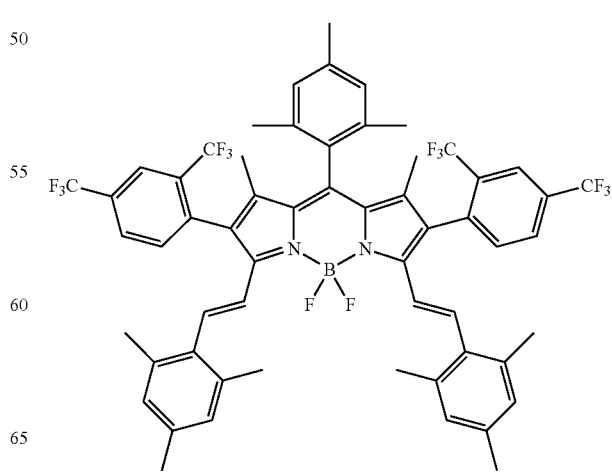

-continued
F-27
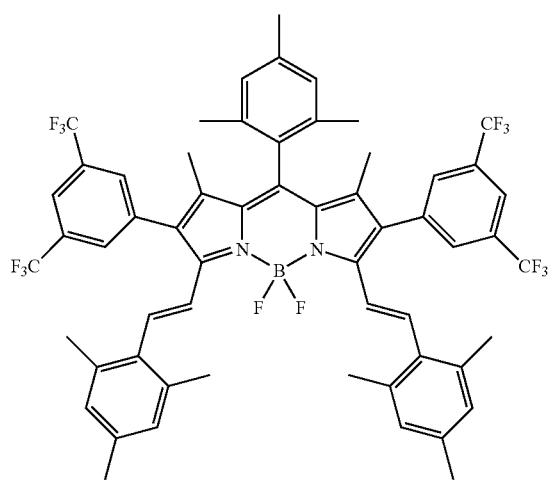
F-30
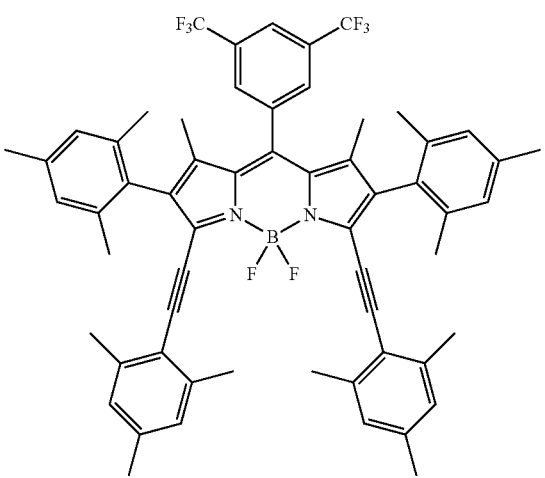
F-28
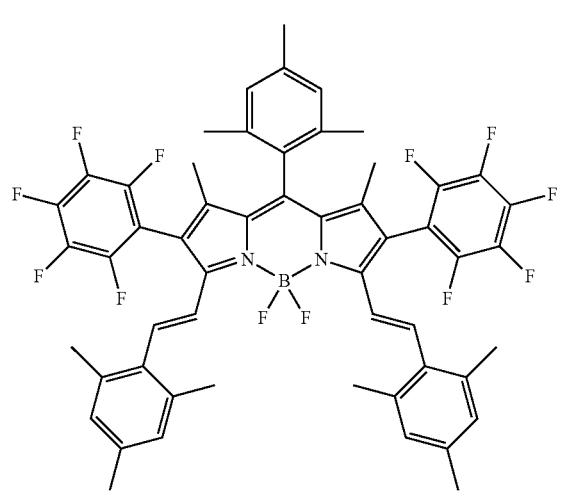
F-31
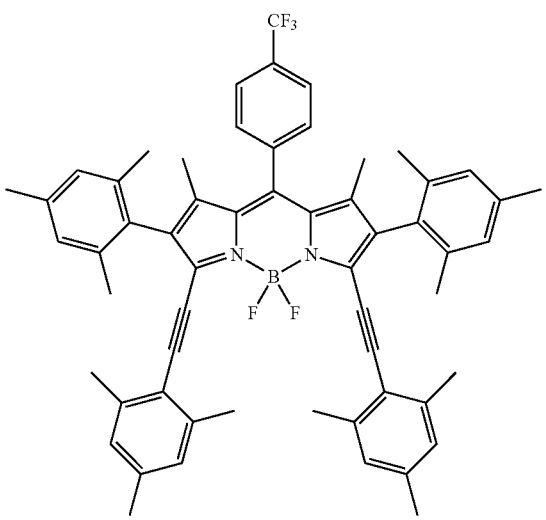
F-29
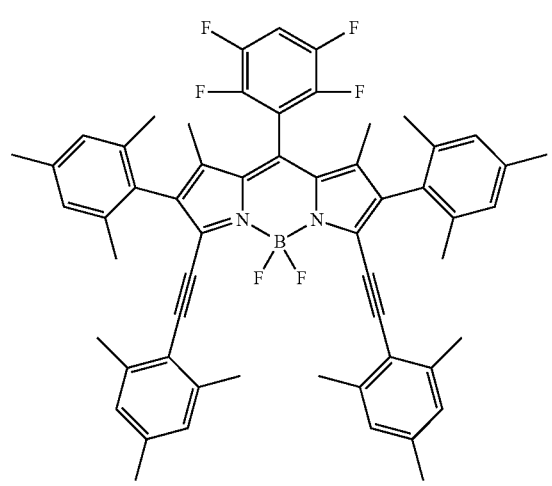
F-32
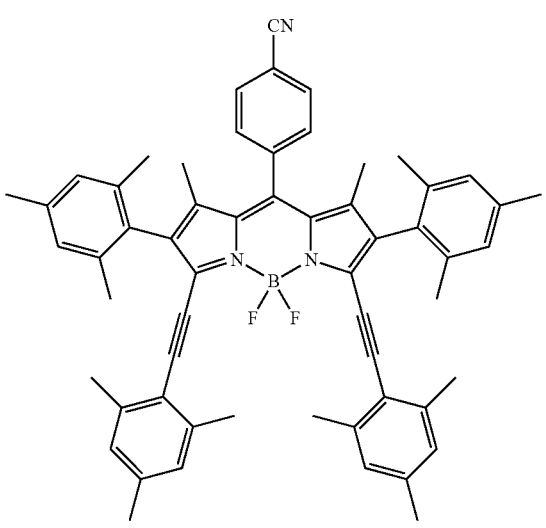

-continued
F-33
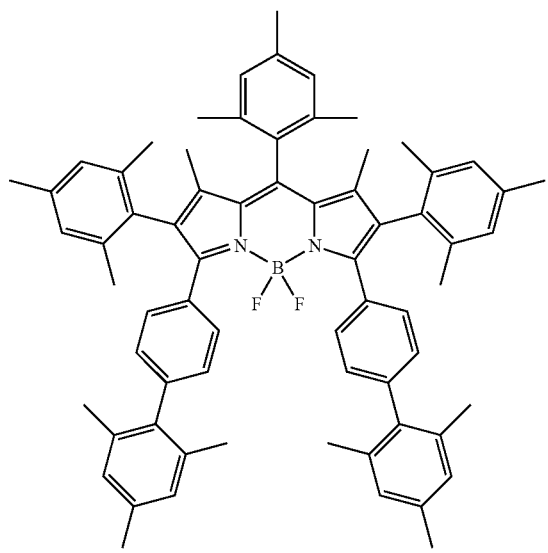
F-34
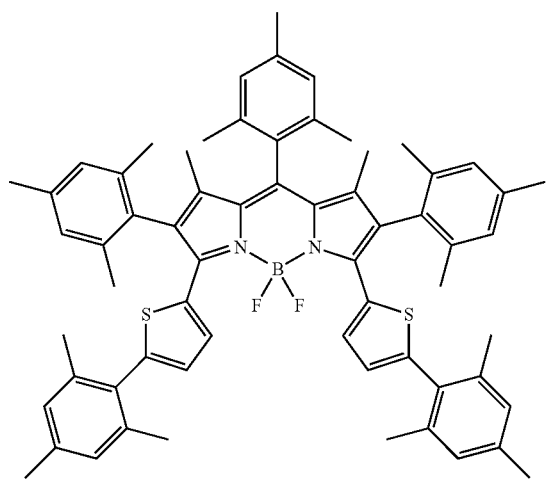
F-35
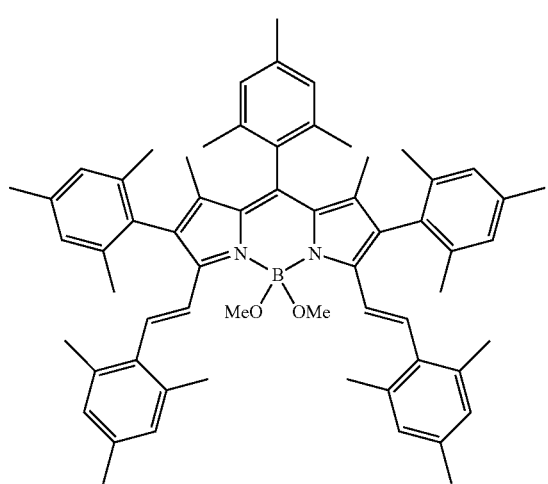
F-36
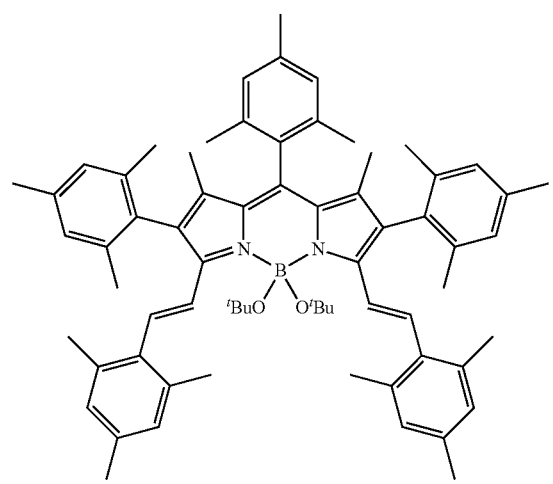
F-37
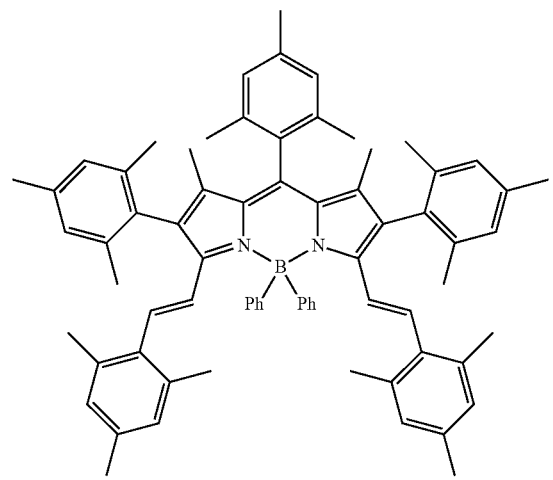
F-38
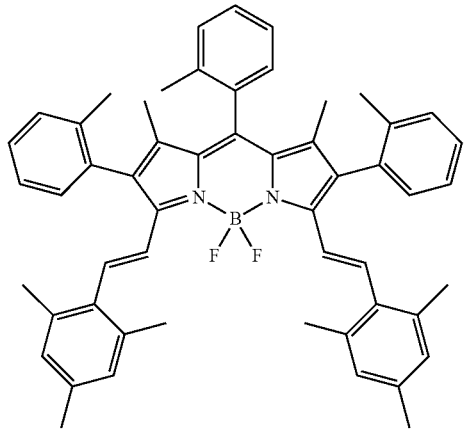

-continued
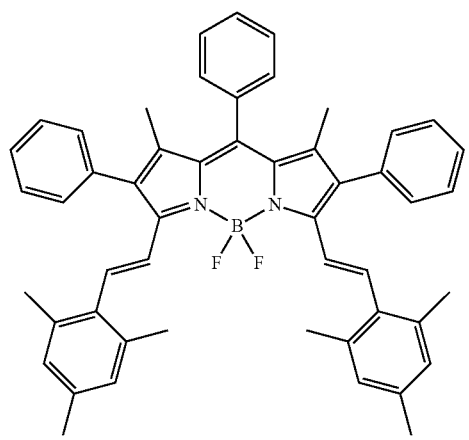
F-39
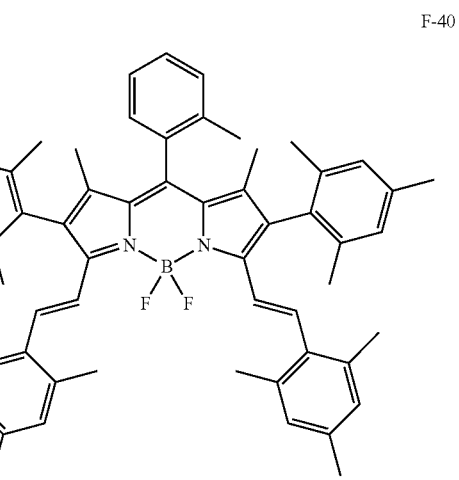
F-40
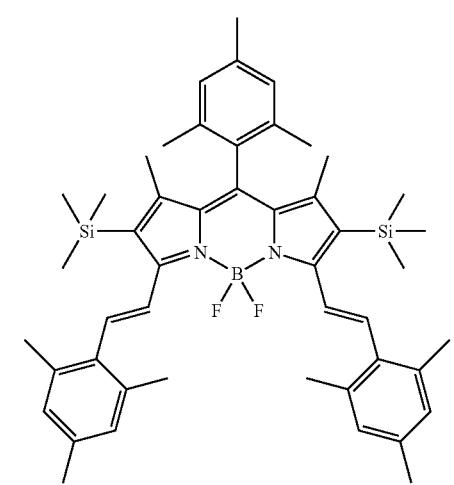
F-41
-continued
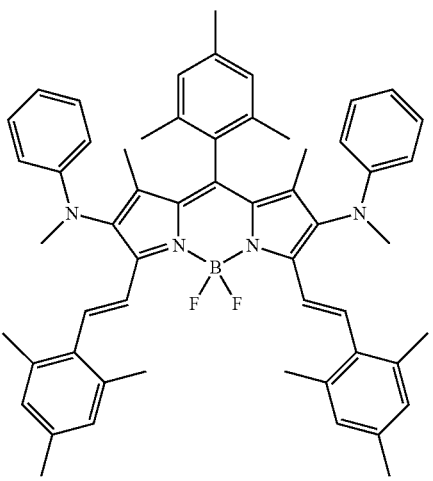
F-42
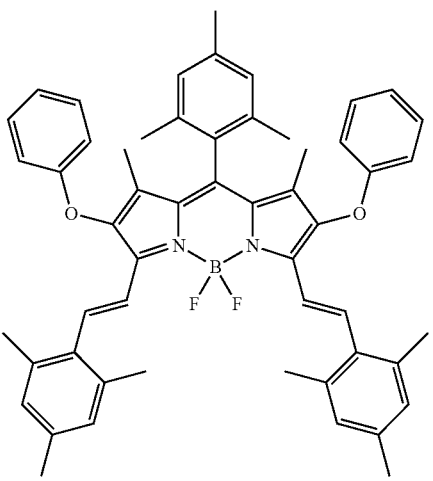
F-43
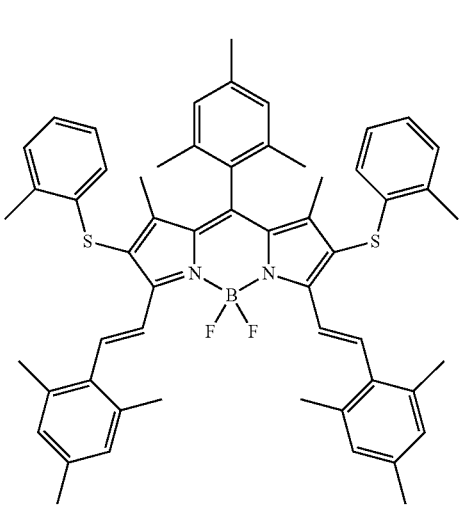
F-44

F-45
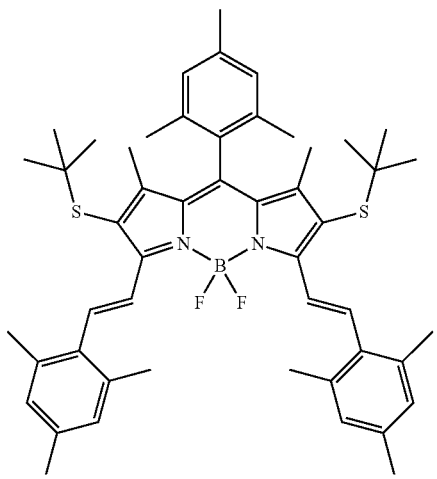
F-46
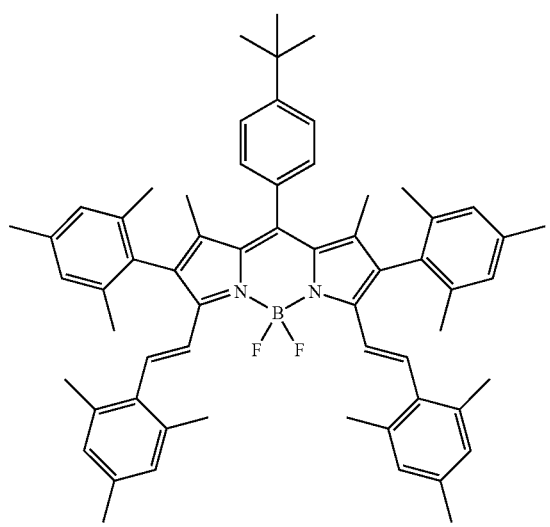
F-47
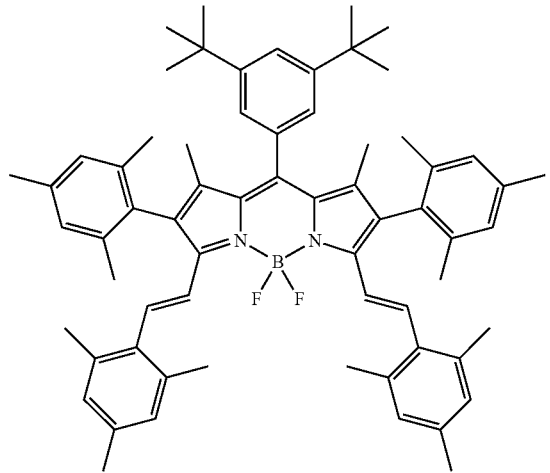
F-48
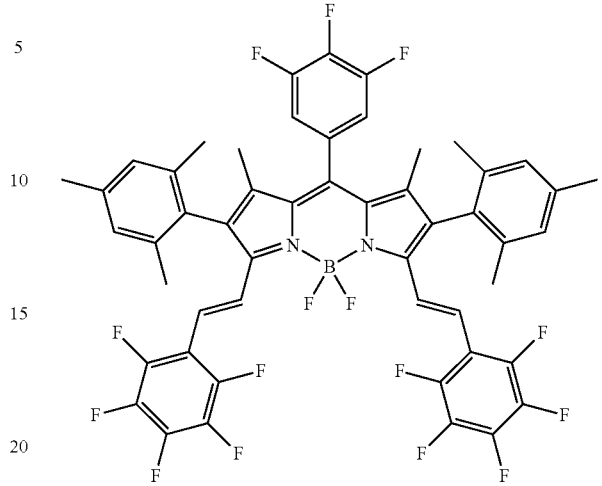
F-49
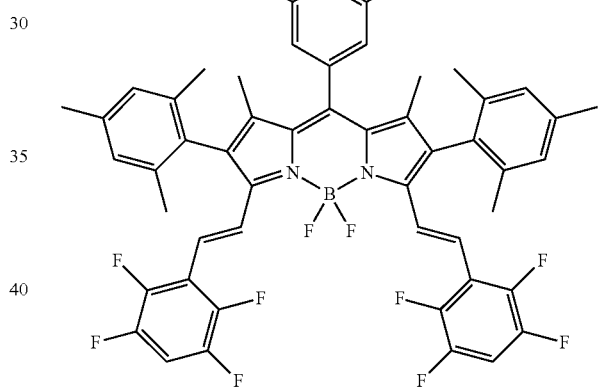
F-50
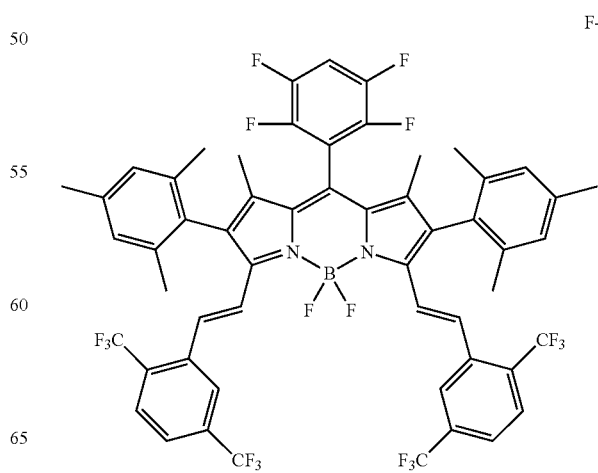

-continued
F-51
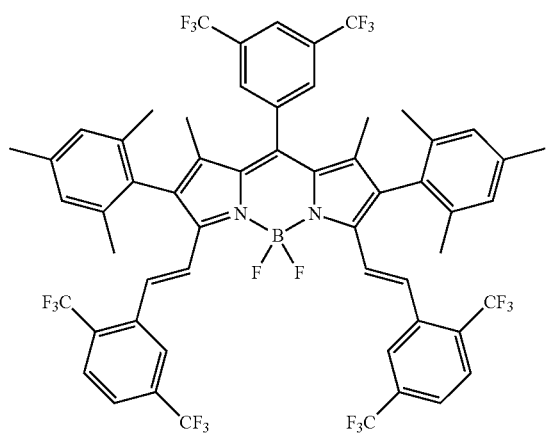
F-54
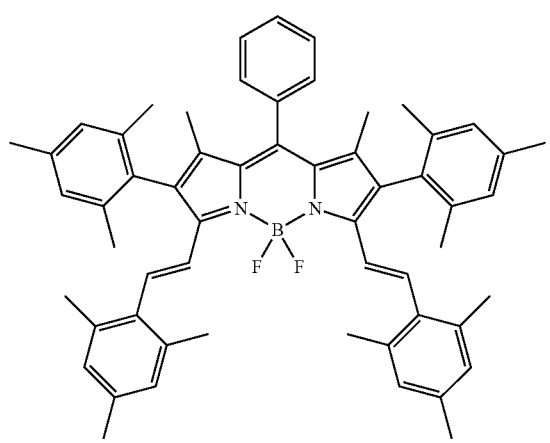
F-52
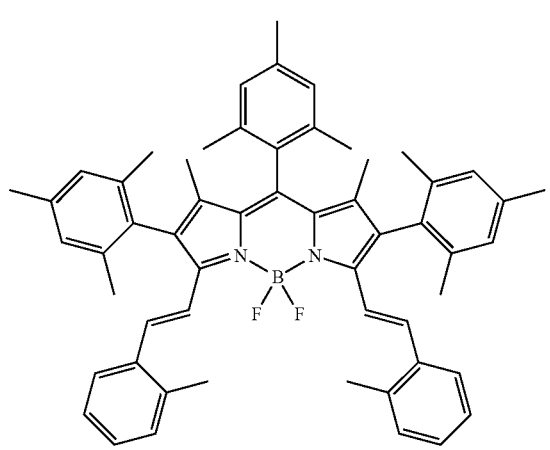
F-55
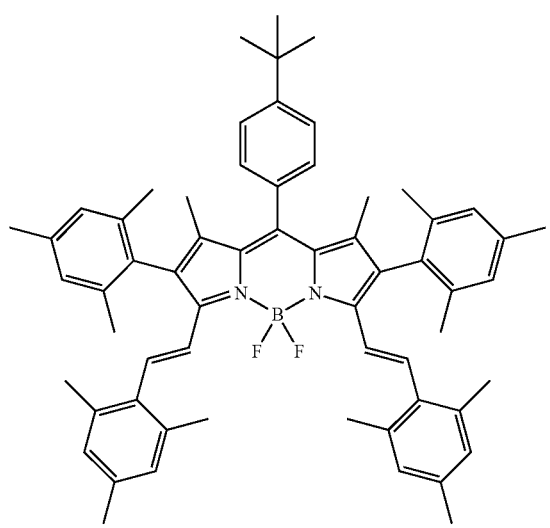
F-53
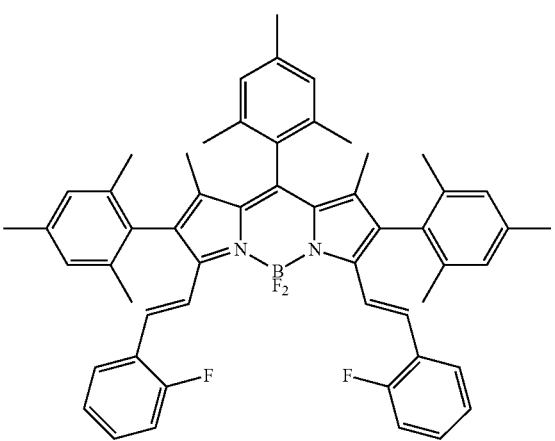
F-56
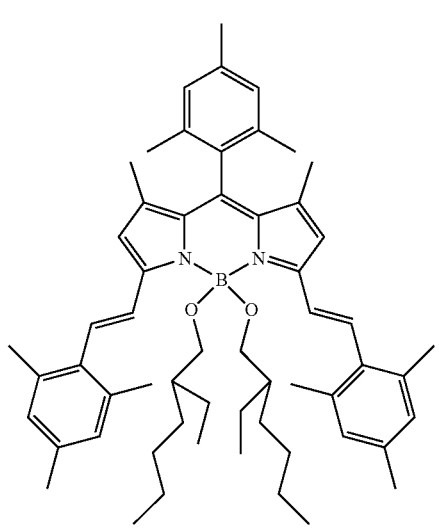

-continued
F-57
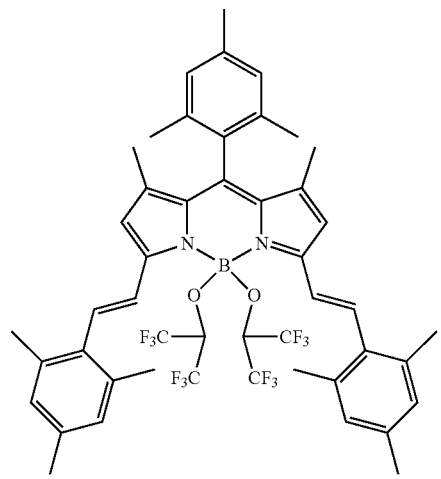
F-58
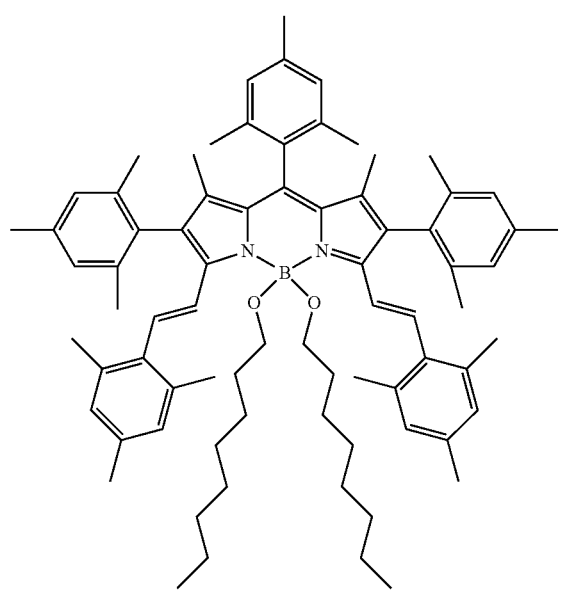
F-59
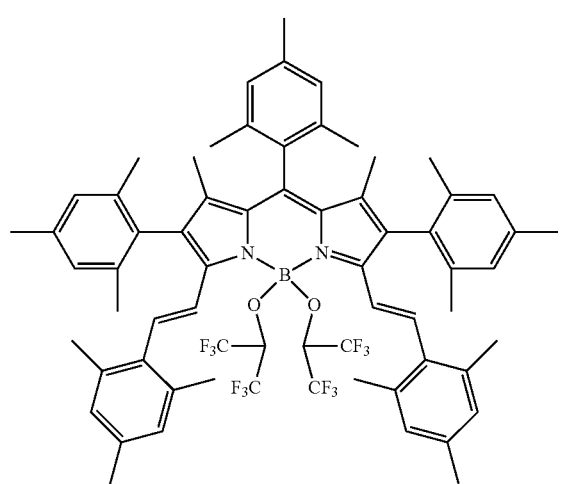
-continued
F-60
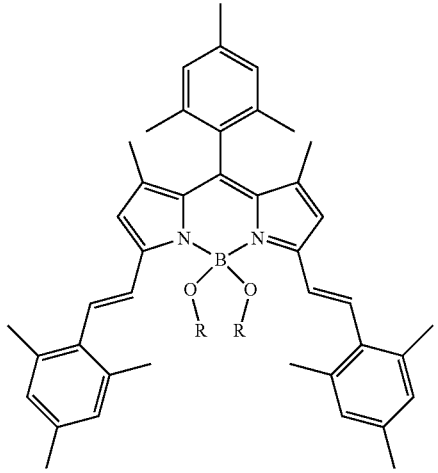
R = —CH$_2$(CF$_2$)$_6$CF$_3$
F-61
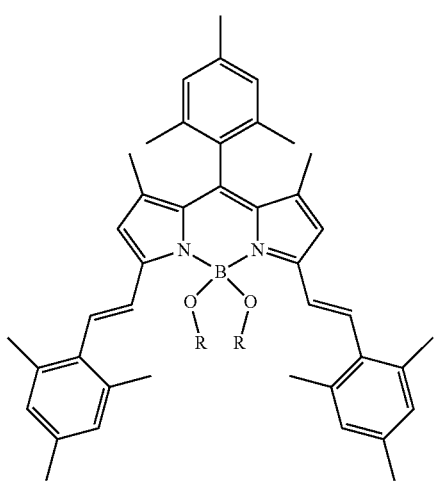
R = —CH$_2$CH$_2$(CF$_2$)$_5$CF$_3$
F-62
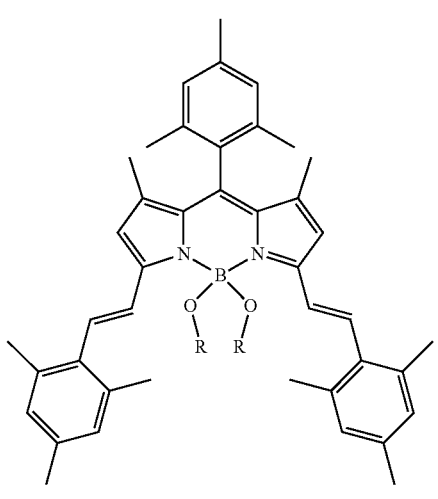
R = —CH$_2$(CF$_2$)$_8$CF$_3$

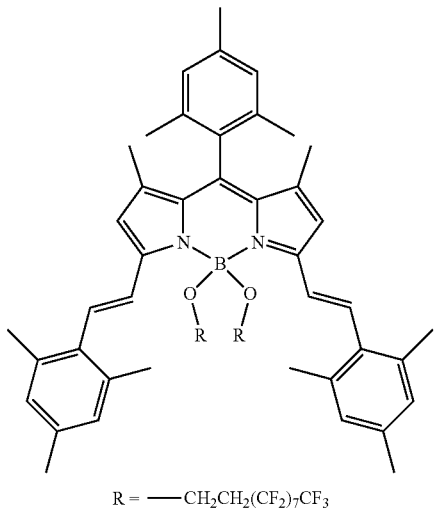

F-63

R = ——CH$_2$CH$_2$(CF$_2$)$_7$CF$_3$

<Method for Producing Compound Represented by Formula (1)>

The compound represented by Formula (1) can be produced, for example, by the synthesis scheme shown in the Examples which will be described later.

As an example, the synthesis of Compound (2) of the Examples is outlined below. 2,4-dimethylpyrrole is added dropwise to a mixture of 2,4,6-trimethylbenzaldehyde and dichloromethane while cooling with water, to which trifluoroacetic acid is then added, the mixture is stirred at room temperature. While further cooling with water, 2,3-dichloro-5,6-dicyano-p-benzoquinone (DDQ) is added thereto, followed by stirring at room temperature.

Then, diisopropylethylamine is added dropwise thereto while cooling with water, followed by stirring at room temperature. Subsequently, a boron trifluoride diethyl ether complex is added dropwise thereto while cooling with water, and the reaction is carried out with stirring at room temperature, whereby Compound (2-A) can be obtained. Subsequently, Compound (2-A), 2,4,6-trimethylbenzaldehyde and toluene are mixed, piperidine and p-toluenesulfonic acid are added thereto, and the reaction is carried out under refluxing, whereby Compound (2) can be produced.

As another example, Compound (3) can be produced through Compound (2-A), Compound (3-A), and Compound (3-B) according to the synthesis scheme of Compound (3) in Examples described later, using 2,4,6-trimethylbenzaldehyde and 2,4-dimethylpyrrole as starting compounds.

As another example, Compound (8) can be produced through Compound (8-A) according to the synthesis scheme of Compound (3) in Examples described later, using Compound (3-A) as a starting compound.

The compound represented by Formula (1) other than Compound (2), Compound (3), and Compound (8) can also be produced by replacing the compound used in the reaction with a compound having a substituent corresponding to the desired compound represented by Formula (1).

<Luminescent Resin Composition>

The resin used in the luminescent resin composition of the present invention may be any of a thermoplastic polymer compound, a heat- or photo-curable polymer compound, or a mixture thereof. In the present specification, the term "polymer compound" means that it also includes a monomer or polymerization precursor of a polymer compound, in a case where the polymer compound is a heat- or photo-curable polymer compound.

In addition, the wavelength conversion luminescent resin composition according to the embodiment of the present invention takes a form other than particles (non-particle form). Therefore, the resin is not used in the form of particles in the present invention.

The resin used in the present invention is preferably transparent (transmittance of visible light (wavelength of 300 to 830 nm) is 50% or more) or translucent. Specific examples of the resin include an acrylic resin, a methacrylic resin, a curable polymer compound having a reactive vinyl group such as vinyl polycinnamate, a polycarbonate, a polyimide, a polyamideimide, a polyesterimide, a polyetherimide, a polyetherketone, a polyether ether ketone, a polyether sulfone, a polysulfone, a polyparaxylene, a polyester, a polyvinyl acetal, a polyvinyl chloride, a polyvinyl acetate, a polyamide, a polystyrene, a polyurethane, a polyvinyl alcohol, a cellulose acylate, a fluorinated resin, a silicone resin, an epoxy silicone resin, a phenol resin, an alkyd resin, an epoxy resin, a maleic acid resin, a melamine resin, a urea resin, an aromatic sulfonamide, a benzoguanamine resin, a silicone-based elastomer, and a cyclic olefin copolymer. These resins may be used alone or in combination of two or more thereof. Those having a molecular weight of about 1,000 to 100,000 as a weight-average molecular weight can usually be used, but resin compounds having a molecular weight outside this range can also be used.

In the luminescent resin composition of the present invention, the amount of the compound represented by Formula (1) with respect to the resin is not particularly limited but is usually preferably 0.01% to 80% by mass, more preferably 0.01% to 60% by mass, and most preferably 0.01% to 30% by mass with respect to the total mass of the resin.

In the composition of the present invention, at least one compound represented by Formula (1) is used, but two or more compounds represented by Formula (1) may be used. In a case where two or more compounds represented by Formula (1) are used, it is preferred that the total amount thereof falls within the above range.

The luminescent resin composition of the present invention can also contain, for example, a coloring agent for tone correction, a processing/oxidation and heat stabilizer (antioxidant, phosphorus-based processing stabilizer, or the like), a light resistance stabilizer (an ultraviolet absorber, or the like), and a silane coupling agent, in addition to the compound represented by Formula (1) and the resin.

Specific examples of the coloring agent for tone correction include a perylene-based pigment, an anthraquinone-based pigment, a lake-based pigment, an azo-based pigment, a quinacridone-based pigment, an anthracene-based pigment, an isoindoline-based pigment, an isoindolinone-based pigment, a phthalocyanine-based pigment, a triphenylmethane-based basic dye, an indanthrone-based pigment, an indophenol-based pigment, a cyanine-based pigment, a dioxazine-based pigment, a coumarin-based dye, and a mixture of two or more thereof.

Specific examples of processing/oxidation and heat stabilizer include phosphite esters such as tributyl phosphite, tris(2-ethylhexyl)phosphite, tridecyl phosphite, tristearyl phosphite, triphenyl phosphite, tricresyl phosphite, tris(nonylphenyl)phosphite, tris(2,4-di-tert-butylphenyl)phosphite, decyl-diphenyl phosphite, phenyl-di-2-ethylhexyl phosphite, phenyl-didecyl phosphite, tricyclohexyl phosphite, distearyl-pentaerythrityl-diphosphite, tris(mixed mono-, diphenyl)phosphite, dinonylphenyl-bis(nonylphenyl)phosphite, and octyl-[2,2'-di(4,6-di-tert-butylphenyl) methylene] phosphate;

phosphines such as triethylphosphine, triisopropylphosphine, tri-n-butylphosphine, tricyclohexylphosphine, allyldiphenylphosphine, triphenylphosphine, diphenylphosphine, tris(2,4-dimethylphenyl)phosphine, tris(2,4,6-trimethylphenyl)phosphine, tris(o-tolyl)phosphine, tris(o-anisyl)phosphine, diphenylbutylphosphine, diphenyloctadecylphosphine, tris(p-nonylphenyl)phosphine, tris(naphthyl)phosphine, diphenyl-(hydroxymethyl)phosphine, diphenylbenzylphosphine, diphenyl-(p-hydroxyphenyl)phosphine, diphenyl-(2,5-dihydroxyphenyl)phosphine, and phenylnaphthylbenzylphosphine; phosphonites such as triphenylphosphonite, dinonylphenylphosphonite, diisooctylphenylphosphonite, phenyl(2,4,6-trimethylphenyl)phenylphosphonite, and tetrakis(2,4-di-tert-butylphenyl)-4',4''-biphenylene diphosphonite; and phenolic antioxidants such as 2,6-di-tert-butyl-p-cresol, 2,6-di-tert-butyl-p-ethylphenol, 2,2'-methylenebis(6-tert-butyl-p-cresol), 4,4'-methylenebis(6-tert-butyl-o-cresol), 4,4'-methylenebis(6-tert-butyl-m-cresol), tetrakis-[methylene-3-(3',5'-di-tert-butyl-4'-hydroxyphenyl)propionate]methane, 4,4'-thiobis(6-tert-butyl-m-cresol), stearyl-β-(3,5-di-tert-butyl-4-hydroxyphenyl)propionate, 1,3,5-trimethyl-2,4,6-tris(3,5-di-tert-butyl-4-hydroxybenzyl)benzene, octadecyl 3-(3,5-di-tert-butyl-4-hydroxyphenyl)propionate, and 3,5-di-tert-butyl-4-hydroxybenzylphosphonate-diethyl ester. These processing, oxidation, and heat stabilizers may be used alone or in combination of two or more thereof.

Examples of the light resistance stabilizer include benzotriazoles such as 2-(5-methyl-2-hydroxyphenyl)benzotriazole, 2-[2-hydroxy-3,5-bis(α,α-dimethylbenzyl)phenyl]-2H-benzotriazole, and 3',3'-bis[2-(5'-octyl-2'-hydroxyphenyl)benzotriazodyl]methane. These light resistance stabilizers may be used alone or in combination of two or more thereof.

The silane coupling agent is preferably a compound having an epoxy group or an amino group, specific examples of which include β-(3,4-epoxycyclohexyl)ethyltrimethoxysilane, γ-glycidoxypropyltrimethoxysilane, γ-glycidoxypropylmethyldiethoxysilane, N-β-aminoethyl-γ-aminopropyltrimethoxysilane, n-β-aminoethyl-γ-aminopropylmethyldimethoxysilane, γ-aminopropyltriethoxysilane, and N-phenyl-γ-aminopropyltrimethoxysilane.

The coloring agent for tone correction, the processing/oxidation and heat stabilizer, the light resistance stabilizer, and the silane coupling agent are preferably added in an amount exhibiting tone correction effects and stabilizing effects, and are preferably used in an amount of usually about 0.1 ppm to 10% by mass with respect to the mass of the resin.

Additives such as an organic acid, a matting agent, a radical scavenger, a deterioration inhibitor, a filler (for example, silica, glass fiber, or glass beads), a plasticizer, a lubricant, a flame retardant (for example, an organohalogen-based compound), a flame retardant aid, an antistatic agent, a chargeability imparting agent, an impact modifier, a discoloration preventing agent, a releasing agent (for example, a higher fatty acid ester of a monohydric or polyhydric alcohol), a flowability improver, and a reactive or non-reactive diluent can be blended appropriately in the luminescent resin composition of the present invention.

[Method for Producing Wavelength Conversion Luminescent Resin Composition]

The method for producing a wavelength conversion luminescent resin composition according to the embodiment of the present invention is not particularly limited and examples thereof include the following methods.

(Method A) A method including a step of drying a solution containing at least one compound represented by Formula (1) and a resin in a solvent:

For example, the organic solvent can be removed by dissolving or suspending the compound represented by Formula (1) in an organic solvent solution of the resin, followed by drying.

(Method B) A method including a step of curing a composition containing at least one compound represented by Formula (1) and a monomer and/or a polymerization precursor:

After dispersing the compound represented by Formula (1) in a monomer or polymerization precursor of a heat- or photo-curable polymer, the monomer or polymerization precursor can be polymerized. Alternatively, after dissolving or suspending the compound represented by Formula (1) in a solution of the monomer or polymerization precursor, the organic solvent may be removed to polymerize the monomer or polymerization precursor.

(Method C) A method including a step of melting a composition containing at least one compound represented by Formula (1) and a resin:

For example, melting can be made after dispersing the compound represented by Formula (1) in a resin.

As a method of dispersing the compound represented by Formula (1) in the resin, it is possible to use melt blending, mixing with a powder of a polymer compound, or the like. In a case where melt blending is carried out, a common device used for melt blending rubber or plastics, for example, a heat roll, a tumbler mixer, a V-blender, a Nauta mixer, a Henschel mixer, a ribbon blender, a super mixer, a Banbury mixer, a Brabender, or an extruder can be used. The melting temperature is preferably set at a temperature at which the resin is meltable and which is equal to or lower than the temperature at which the resin begins to thermally decompose, and the temperature is usually 150° C. to 450° C. and preferably 180° C. to 400° C. In a case where the compound represented by Formula (1) is dispersed in the monomer or polymerization precursor, a method of dispersing the compound represented by Formula (1) in a liquid of the monomer using, for example, a paint shaker, a mixer, or a homogenizer can be used in a case where the monomer or polymerization precursor is a liquid, and a method of dispersing the compound represented by Formula (1) in a powder of the monomer using, for example, a ball mill or a sand mill can be used in a case where the monomer is a solid.

As the organic solvent used for dispersing or dissolving the compound represented by Formula (1) using an organic solvent as a medium, for example, hydrocarbons such as hexane, octane, decane, toluene, xylene, ethylbenzene, and 1-methylnaphthalene; ketone-based solvents such as acetone, methyl ethyl ketone, methyl isobutyl ketone, and cyclohexanone; halogenated hydrocarbon solvents such as dichloromethane, chloroform, tetrachloroethane, dichloroethane, trichloroethane, tetrachloroethane, chlorobenzene, dichlorobenzene, and chlorotoluene; ester-based solvents such as ethyl acetate, butyl acetate, and amyl acetate; alcohol-based solvents such as methanol, ethanol, propanol, butanol, pentanol, hexanol, cyclohexanol, methyl cellosolve, ethyl cellosolve, ethylene glycol, and diethylene glycol; ether-based solvents such as dibutyl ether, tetrahydrofuran, dioxane, and anisole; polar solvents such as N,N-dimethylformamide, N,N-dimethylacetamide, 1-methyl-2-pyrrolidone, 1,3-dimethylimidazolidinone, and dimethyl sulfoxide; and water can be used. These organic solvents may be used alone or in combination of two or more thereof. As a method of removing the organic solvent, a method in which the mixed organic solvent solution is heated to a temperature equal to or higher than the boiling point of the organic solvent and equal to or lower than the decomposition temperature of the polymer compound or monomer and the pyrromethene boron complex compound to evaporate and remove the organic solvent may be used, or alternatively, a method of evaporating and removing the organic solvent under reduced pressure (equal to or lower than atmospheric pressure) pressure may be used.

In a case where the resin is a thermoplastic polymer compound, the method of molding the luminescent resin composition of the present invention can be carried out by a molding method such as injection molding, compression molding, transfer molding, or extrusion molding. In a case where the resin is a heat- or photo-curable polymer compound, the polymerization method may be carried out by common thermopolymerization or photopolymerization. In a case of thermopolymerization, it can usually be carried out by adding a catalyst to the luminescent resin composition of the present invention as needed, followed by heating. The heating temperature is usually in the range from room temperature to the glass transition temperature or melting point of the target polymer compound or higher, but it may be gradually raised from around room temperature in accordance with the progress of polymerization. Examples of the catalyst include a radical polymerization catalyst, an anionic polymerization catalyst, a cationic polymerization catalyst, and a hydrosilylation catalyst. Examples of the radical polymerization catalyst include azobisisobutyronitrile, benzoyl peroxide, di-3-methoxybutyl peroxydicarbonate, diisopropyl peroxycarbonate, α-cumyl peroxyneodecanoate, tert-butylperoxy-2-ethylhexanoate, dicumyl peroxide, 1,1-di-tert-butylperoxy-3,3,5-trimethylcyclohexane, and tert-butylcumyl peroxide.

Examples of the anionic polymerization catalyst include tetrabutylammonium chloride, tetrabutylammonium hydroxide, triethylamine, tributylamine, pyridine, N-methylpyrrolidone, piperidine, triphenylphosphine, tributylphosphine, triethanolamine, methyldiethanolamine, triisopropanolamine, 4,4'-dimethylaminobenzophenone, 2-dimethylaminoethylbenzoic acid, ethyl dimethylaminobenzoate, isoamyl dimethylaminobenzoate, (n-butoxy)ethyl dimethylaminobenzoate, isoamyl 2-dimethylaminoethylbenzoate, and 2-ethylhexyl 2-dimethylaminoethylbenzoate.

Examples of the cationic polymerization catalyst include sulfuric acid, hydrochloric acid, p-toluenesulfonic acid, methanesulfonic acid, phosphoric acid, acetic acid, propionic acid, dibutyltin dioxide, dimethyltin dichloride, dibutyltin dichloride, dibutyltin dilaurate, tetrabutyltin, boron trifluoride, tetraethoxy titanium, and titanium oxide. The addition amount of these polymerization catalysts greatly varies depending on the type of the monomer and/or the polymerization precursor and the composition containing them and therefore is not particularly limited, but it is usually in the range of 0.0001% to 10% by mass with respect to the mass of the monomer and/or the polymerization precursor.

The hydrosilylation catalyst may be, for example, platinum.

In a case of photopolymerization, polymerization is carried out by adding a photopolymerization initiator to the luminescent resin composition, if necessary, followed by irradiation with light. In addition, the radical polymerization catalyst, the anionic polymerization catalyst, the cationic polymerization catalyst, and the like may be used in combination. Examples of the photopolymerization initiator include a photo radical generator, a photo anion generator, and a photo cation generator, among which a photo radical generator and a photo cation generator are preferable. Examples of the photo radical generator include 4-phenoxydichloroacetophenone, 4-tert-butyldichloroacetophenone, diethoxyacetophenone, 2-hydroxy-2-methyl-1-phenylpropan-1-one, 1-(4'-isopropylphenyl)-2-hydroxy-2-methylpropan-1-one, 1-(4'-dodecylphenyl)-2-hydroxy-2-methylpropan-1-one, 1-hydroxycyclohexyl phenyl ketone, 2-methyl-1-[4'-(methylthio)phenyl]-2-morpholinopropan-1-one, benzoin, benzoin methyl ether, benzoin ethyl ether, benzoin isobutyl ether, benzoin dimethyl ketal, benzophenone, benzoyl benzoic acid, methyl benzoylbenzoate, 4-phenylbenzophenone, hydroxybenzophenone, allylated benzophenone, 4-benzoyl-4'-methyldiphenylsulfide, 3,3'-dimethyl-4-methoxybenzophenone, thioxanthone, 2-chlorothioxanthone, 2-methylthioxanthone, isopropylthioxanthone, 2,4-dichlorothioxanthone, 2,4-dimethylthioxanthone, 2,4-diethylthioxanthone, 2,4-diisopropylthioxanthone, 2,4,6-trimethylbenzoyldiphenylphosphine oxide, methylphenylglyoxylate, dibenzyl, 9,10-phenanthrenequinone, camphorquinone, dibenzosuberone, 2-ethylanthraquinone, 4',4"-diethylisophthaloquinone, and 3,3',4,4'-tetra (tert-butylperoxycarbonyl)benzophenone. The addition amount thereof greatly varies depending on the type of the monomer and/or the polymerization precursor and the composition containing them and therefore is not particularly limited, but it is usually in the range of 0.0001% to 10% by mass with respect to the mass of the monomer and/or the polymerization precursor.

Examples of the photo cation generator include an aromatic diazonium salt, an aromatic sulfonium salt, an aromatic iodonium salt, an onium salt of Brønsted acid, and an iron aromatic compound salt, among which an aromatic sulfonium salt, an aromatic iodonium salt, and an iron aromatic compound salt of Brønsted acid are preferably used. Examples of the aromatic sulfonium salt include a terphenylsulfonium tetrafluoroborate salt, a triphenylsulfonium hexafluorophosphonium salt, and a triphenylsulfonium hexafluoroantimonium salt.

CYRACURE UVI-6974 (manufactured by UCC), CYRACURE UVI-6990 (manufactured by UCC), OPTOMER SP150 (manufactured by Asahi Denka Kogyo K.K.), OPTOMER SP170 (manufactured by Asahi Denka Kogyo K.K.), and the like, which are all trade names and are commercially available as modified versions of aromatic sulfonium salts capable of generating free radicals, can also be mentioned. As the iron aromatic compound salt of Brønsted acid, the trade name: CG 24-061 (manufactured by Ciba-Geigy AG) can be mentioned. The addition amount thereof greatly varies depending on the type of the monomer and/or the polymerization precursor and the composition containing them and therefore is not particularly limited, but it is usually in the range of 0.0001% to 10% by mass with respect to the mass of the monomer and/or the polymerization precursor. Ultraviolet light or visible light of about 100 to 800 nm is preferably used as the radiated light. In a case where ultraviolet light of 400 nm or less is used, a light source such as a low-pressure mercury lamp, a high-pressure mercury lamp, an extra-high pressure mercury lamp, a metal halide lamp, a pulse xenon lamp, or an electrodeless discharge lamp is preferably used.

[Wavelength Conversion Member]

The wavelength conversion member according to the embodiment of the present invention can be obtained by molding the luminescent resin composition for a wavelength conversion member according to the embodiment of the present invention. The molding method may be carried out by a method of molding in a hot melt state such as injection molding, or a method in which a solution is prepared with an organic solvent capable of dissolving a resin and then a film is formed by a spin coating method, a roll coating method, a bar coating method, a Langmuir-Blodgett method, a casting method, a dipping method, a screen printing method, a BUBBLE JET (registered trademark) method, or an ink jet method. In a case where the resin contained in the luminescent resin composition of the present invention is a heat- or photo-curable polymer compound, the molding method can be carried out by filling a suitable mold with a composition obtained by mixing the monomer and/or polymerization precursor of the polymer compound and the pyrromethene boron complex compound, followed by polymerization with light or heat. The shape of the wavelength conversion member is not particularly limited, and may be various shapes such as a film shape, a plate shape (for example, a sheet shape, a filter shape, or a disc shape), a lens shape, a fiber shape, and an optical waveguide shape.

In a case where the wavelength conversion member according to the embodiment of the present invention is used in the form of a film, a substrate such as a glass substrate or a polymer substrate may be used as required. Examples of such substrates include glass substrates such as soda-lime glass, barium/strontium-containing glass, lead glass, aluminosilicate glass, borosilicate glass, barium/borosilicate glass, and quartz; and polymer substrates such as polycarbonate, acrylic resin, polyethylene terephthalate, polyether sulfide, and polysulfone. In a case of forming a film, it is possible to form a film using various methods such as a casting method, a spin coating method, a coating method, a vapor deposition method, an electric field method, a printing method, and a casting method.

The wavelength conversion member according to the embodiment of the present invention exhibits a high quantum yield by including the compound represented by Formula (1).

The quantum yield is a ratio of the number of photons emitted as fluorescence to the number of photons absorbed by the luminescent particles.

The quantum yield of the wavelength conversion member according to the embodiment of the present invention is preferably 0.4 or more, more preferably 0.5 or more, still more preferably 0.6 or more, even still more preferably 0.7 or more, and particularly preferably 0.75 or more. The upper limit of the quantum yield is not particularly limited, but generally it is 1.0 or less.

The quantum yield of the luminescent particles of the present invention can be measured using a commercially available quantum yield measuring apparatus, for example, an absolute PL quantum yield spectrometer C9920-02 (manufactured by Hamamatsu Photonics K.K.). PL stands for photoluminescence.

[Application of Present Invention]

The wavelength conversion luminescent resin composition according to the embodiment of the present invention and the wavelength conversion member according to the embodiment of the present invention can be used, for example, in a light-emitting element. The light-emitting element can be constituted of a light source and a wavelength conversion member.

The light source is not particularly limited, and examples thereof include an incandescent bulb, a metal halide lamp, a high intensity discharge lamp (HID lamp), a xenon lamp, a sodium lamp, a mercury lamp, a fluorescent lamp, a cold cathode fluorescent lamp, a cathode luminescence, a low-speed electron-ray tube, light emitting diode [for example, GaP (red, green), $GaP_xAs_{1-x}$ (red, orange, yellow: 0<x<1), $Al_xGa_{1-x}As$ (red: 0<x<1), GaAs (red), SiC (blue), GaN (blue), ZnS, ZnSe], electroluminescence (for example, inorganic EL using a ZnS matrix and a luminescent center, or organic EL), a laser (for example, a gas laser such as a He—Ne laser, a $CO_2$ laser, an Ar, Kr, He—Cd laser, an excimer laser, or a nitrogen laser; a solid laser such as a ruby laser, a YAG laser, or a glass laser; a coloring agent laser, or a semiconductor laser), and sunlight.

A preferred light source is a light emitting diode, electroluminescence, or a semiconductor laser.

The light emitting diode is preferably a semiconductor light-emitting element having a light emitting layer capable of emitting light having a luminescence wavelength that can excite a fluorescent substance. A variety of semiconductors such as ZnSe and GaN can be cited as such a semiconductor light-emitting element, but a nitride semiconductor ($In_xAl_yGa_{1-x-y}$, 0≤X, 0≤Y, X+Y≤1) capable of emitting light having a short wavelength that can efficiently excite a fluorescent substance is preferable. A homo structure, a heterostructure, or a double heterostructure having a metal-insulator-silicon (MIS) junction, a PIN junction, a pn junction, or the like can be mentioned as a semiconductor structure. A variety of luminescence wavelengths can be selected depending on the material of the semiconductor layer and the mixed crystal degree thereof. In addition, the semiconductor light-emitting element can also be configured to have a single quantum well structure or a multiple quantum well structure in which a semiconductor active layer is formed in a thin film in which quantum effects occur.

In a case of emitting light of a white type in a light-emitting element, the luminescence wavelength of the light source is preferably 200 nm or more and 550 nm or less in consideration of the complementary color relationship with the luminescence wavelength from the fluorescent substance and deterioration of the transparent polymer compound; and in order to further improve the excitation of light source and fluorescent substance, and the luminous efficiency, respectively, the luminescence wavelength of the light source is more preferably 300 nm or more and 500 nm or less. A light emitting diode used as a light source for a light-emitting element is usually placed on a substrate having a patterned metal such as copper foil. Here, an insulating organic compound or inorganic compound can be mentioned as the substrate material, and a variety of polymer materials (for example, an epoxy resin and an acrylic resin), inorganic materials (for example, glass and ceramics), and the like can be used. In addition, the shape of the substrate is not particularly limited, and a variety of shapes such as a plate shape (for example, a sheet shape, a filter shape, or a disc shape), a cup shape, and a perforated plate shape can be selected.

As a semiconductor laser that can be used as a light source for a light-emitting element, it is represented by a mechanism in which a semiconductor is pn-junctioned, a forward bias is applied thereto, minority carriers at a high energy level are injected, electrons flowing into a p-type region are recombined with holes and holes flowing into an n-type region are recombined with electrons, electrons are caused to transition from a high energy level to a low energy level, and photons corresponding to the energy difference are emitted. As a material of the semiconductor laser, a group IV element such as germanium or silicon, a direct transition type group III-V or group II-VI compound without lattice vibration such as GaAs or InP, and the like can be given. In addition, these materials may be multi-element systems such as ternary, quaternary, and quinary systems as well as binary systems. In addition, the laminated structure may be a double heterostructure provided with a cladding layer, or may have a structure including a lower cladding, an active layer, and an upper cladding. Further, the laminated structure may be one to which a multiple quantum well structure is applied. The stripe structure for improving the luminous efficiency may be a gain waveguide type or a refractive index distribution waveguide type. Examples of the gain waveguide type include a sandwich type, a planar stripe type, a groove diffusion type, a proton irradiation type, an ISP type, a depletion layer control type, and a mesa stripe type. Examples of the refractive index distribution waveguide type include a CSP type, a PCW type, a TS type, a VSIS type, a TRS type, a groove forming type, a BH type, a DC-PBH type, a V groove type, a U groove type, a mesa type, a TJS type, a DDS type, and a shape distribution type. In addition, the resonator structure may be a distributed feedback (DFB) type or a Bragg reflector (DBR) type.

In a case of converting a wavelength of light of a light source using a light source such as a light emitting diode or a semiconductor laser and the wavelength conversion member according to the embodiment of the present invention, if desired, a color filter may be provided to adjust the color purity. Examples of the color filter include a single substance such as a perylene-based pigment, a lake-based pigment, an azo-based pigment, a quinacridone-based pigment, an anthraquinone-based pigment, an anthracene-based pigment, an isoindoline-based pigment, an isoindolinone-based pigment, a phthalocyanine-based pigment, a triphenylmethane-based basic dye, an indanthrone-based pigment, an indophenol-based pigment, a cyanine-based pigment, or a dioxazine-based pigment, a coloring agent only including a mixture of two or more thereof, and one in a solid state where a coloring agent is dissolved or dispersed in a binder resin.

As a configuration of the light-emitting element, the following example can be given without being particularly limited thereto.

Light source/wavelength conversion member light source/translucent substrate/wavelength conversion member light source/wavelength conversion member/translucent substrate light source/translucent substrate/wavelength conversion member/translucent substrate light source/wavelength conversion member/color filter light source/translucent substrate/wavelength conversion member/color filter light source/wavelength conversion member/translucent substrate/color filter light source/translucent substrate/wavelength conversion member/translucent substrate/color filter light source/translucent substrate/wavelength conversion member/color filter/translucent substrate light source/wavelength conversion member/color filter/translucent substrate The translucent substrate refers to a substrate that can transmit visible light by 50% or more and specific examples thereof include glass substrates (for example, soda-lime glass, barium/strontium-containing glass, lead glass, aluminosilicate glass, borosilicate glass, barium/borosilicate glass, and quartz) and polymer substrates (for example, polycarbonate, acrylic resin, polyethylene terephthalate, polyether sulfide, and polysulfone). In addition, the shape of the translucent substrate is not particularly limited, and may be a plate shape or a lens shape. In a case of preparing a light-emitting element having the above-described structure, the respective constituent elements may be sequentially laminated or may be laminated. In addition, in a case of preparing a light-emitting element, the order thereof is not particularly limited.

The application of the light-emitting element is not particularly limited, and the light-emitting element can be used for various purposes such as for indication, display, traffic signal, traffic display, liquid crystal backlight, liquid crystal front light, field sequential liquid crystal display, general lighting equipment, local lighting, and interior lighting.

Hereinafter, the present invention will be described more specifically with reference to Examples of the present invention. The materials, the used amount, the ratio, the contents of a treatment, the procedures of a treatment, and the like described in Examples below can be suitably modified without departing from the spirit of the present invention. Accordingly, the scope of the present invention should not be limitatively interpreted by the specific examples described below.

EXAMPLES

The terms have the following meanings.
TLC: thin layer chromatography, MS: mass spectrometry
ESI: electrospray ionization
PMMA: polymethyl methacrylate, Si resin: silicone resin,
PVC: polyvinyl chloride, TPU: thermoplastic polyurethane,
PC: polycarbonate, TAC: triacetyl acetate Structure of Compounds of Examples and Comparative Examples Compound (1)

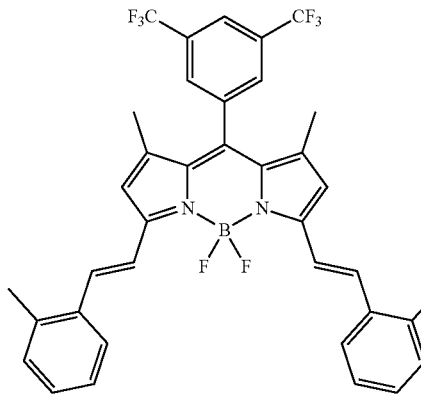

Compound (2)

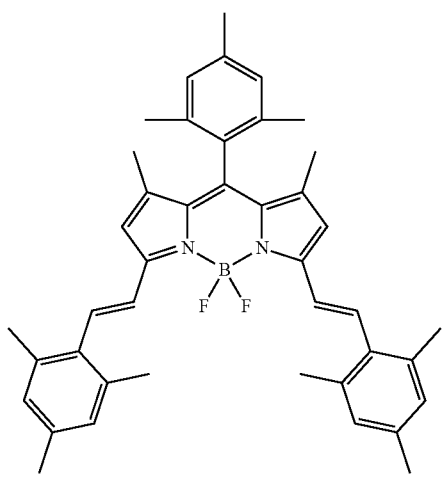

-continued
Compound (3)
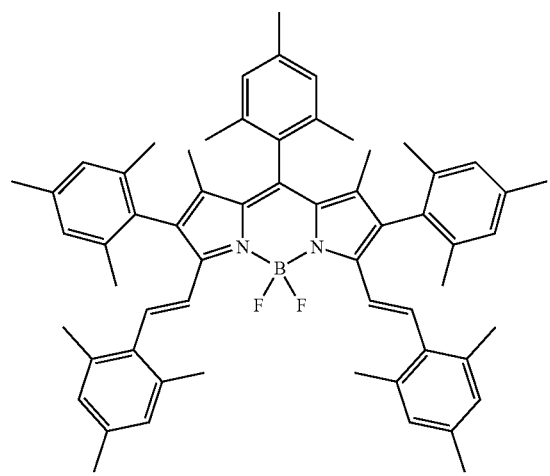
Compound (4)
Compound (6)
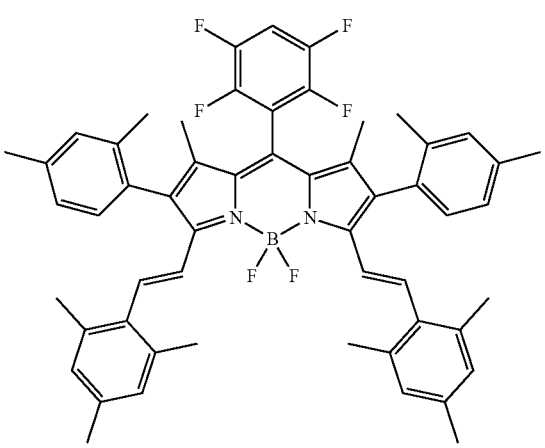
Compound (7)
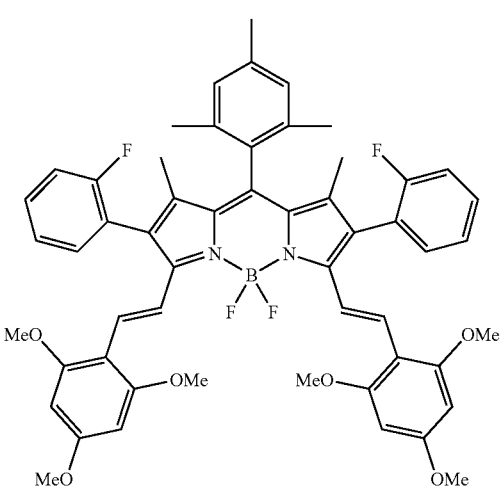
Compound (5)
Compound (8)
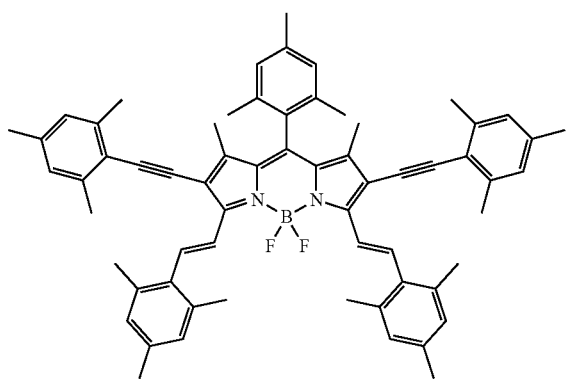

-continued
Compound (9)
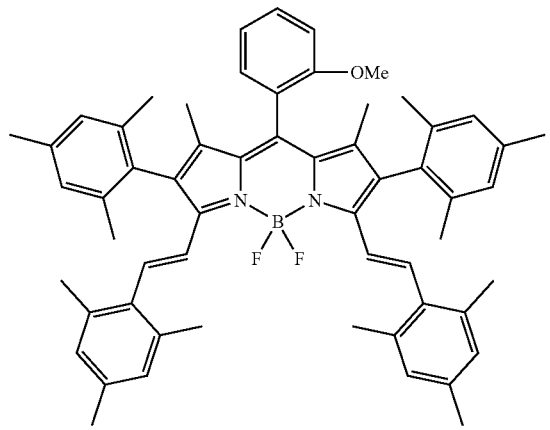
Compound (10)
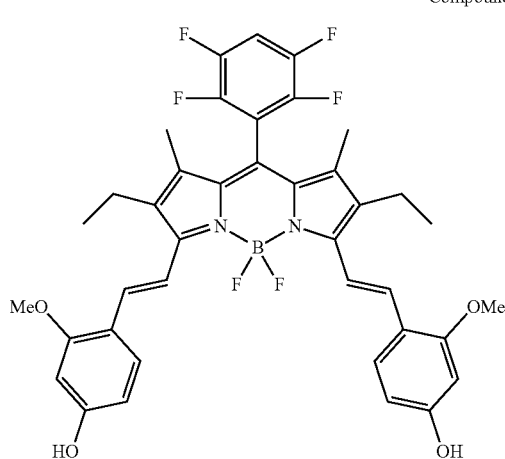
Compound (11)
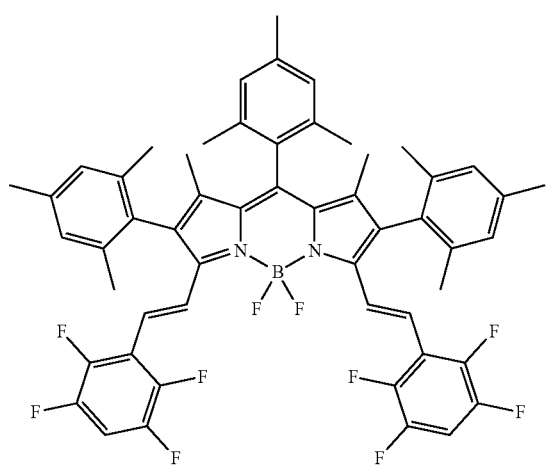
-continued
Compound (12)
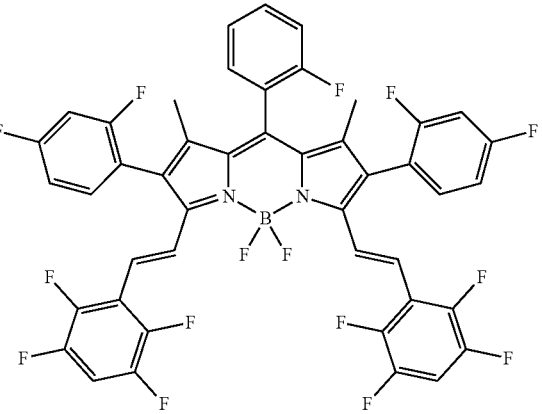
Compound (13)
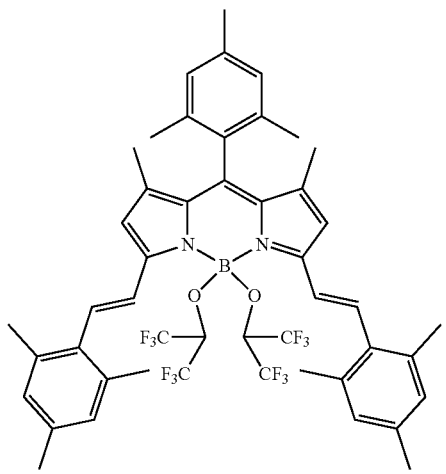
Compound (14)
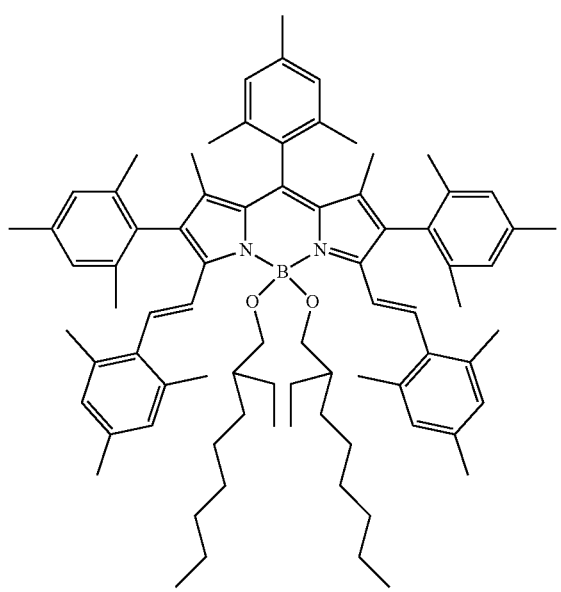

-continued

Comparative Compound (1)

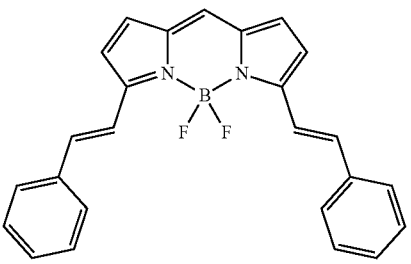

Comparative Compound (2)

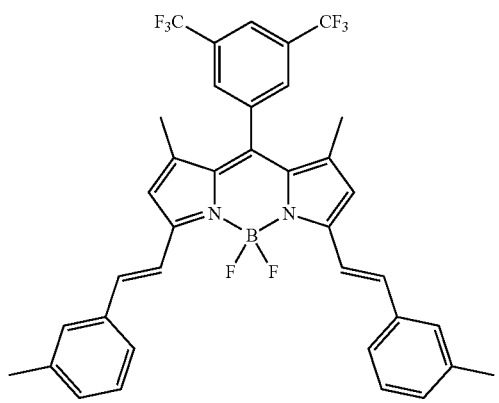

Comparative Compound (3)

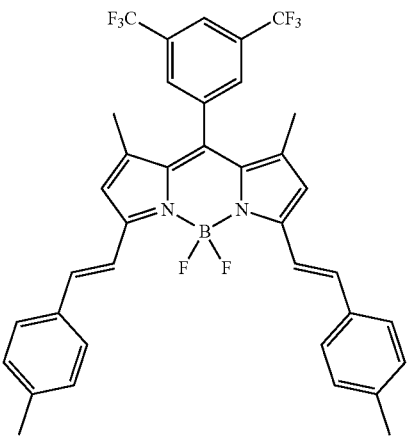

Synthetic Example

Synthesis of Compound (2)

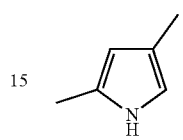

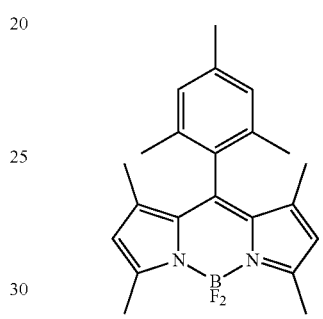

Compound (2-A)

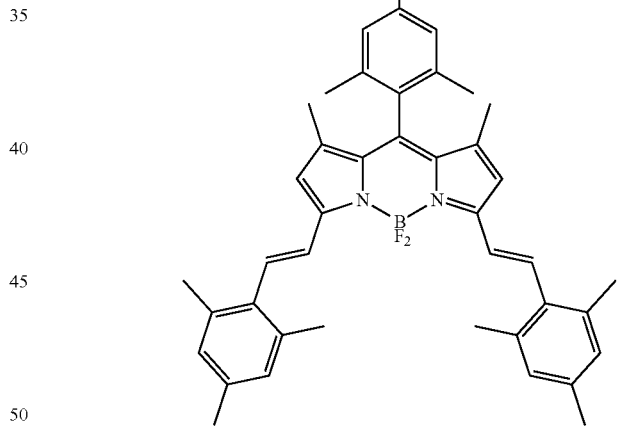

Compound (2)

0.89 g of 2,4,6-trimethylbenzaldehyde and 50 mL of dichloromethane were introduced into a 100 mL three-neck flask under a nitrogen atmosphere, followed by stirring at room temperature. 1.14 g of 2,4-dimethylpyrrole was added dropwise while cooling with water, followed by addition of 5 drops of trifluoroacetic acid and then stirring at room temperature for 1 hour. While cooling with water, 2.72 g of 2,3-dichloro-5,6-dicyano-p-benzoquinone (DDQ) was added, followed by stirring at room temperature for 1 hour, and then 5.43 g of diisopropylethylamine ($N^iPr_2Et$) was added dropwise while cooling with water, followed by stirring at room temperature for 30 minutes. Subsequently, 8.29 mL of a boron trifluoride diethyl ether complex was added dropwise while cooling with water, followed by stirring at room temperature for 1 hour. 100 ml of distilled water was added thereto, and the organic layer obtained by extraction and liquid separation was predried over anhydrous sodium sulfate and then concentrated under reduced pressure. The resulting crude product was purified by silica gel column chromatography (developing solvent: hexane/ethyl acetate) and recrystallized from methanol to obtain 0.98 g of Compound (2-A).

0.37 g of Compound (2-A), 0.59 g of 2,4,6-trimethylbenzaldehyde, and 50 mL of toluene were added to a 100 mL flask, and 5 mL of piperidine and one piece of paratoluenesulfonic acid were added thereto, followed by refluxing in an oil bath for 3 hours. The crude product obtained by concentrating the reaction solution under reduced pressure was purified by silica gel column chromatography (developing solvent: hexane/ethyl acetate) and then recrystallized from methanol to obtain 0.38 g of Compound (2). The compound was identified by ESI-MS. ESI-MS: [M-H]$^-$=625

Synthesis of Compound (3)

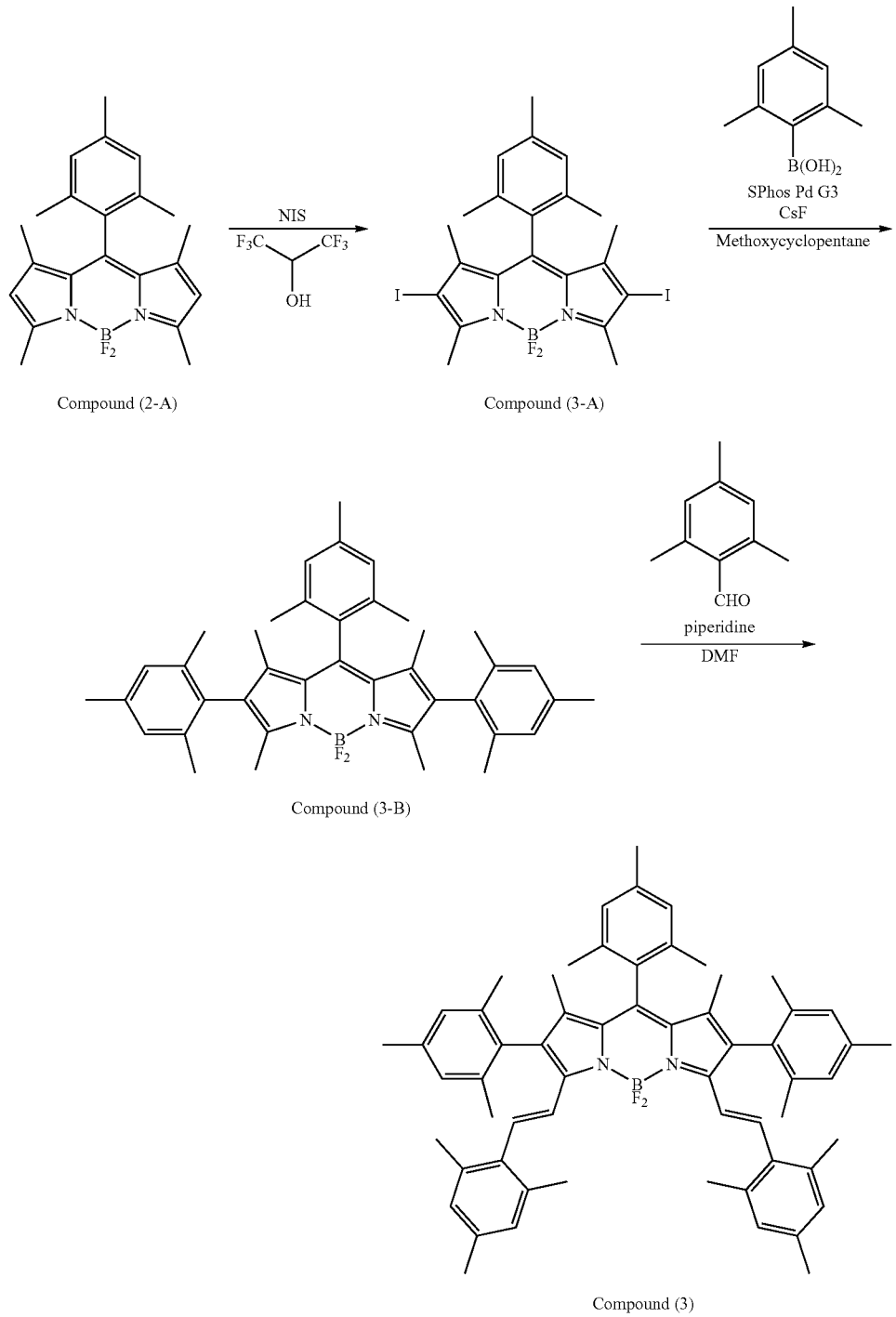

0.89 g of 2,4,6-trimethylbenzaldehyde and 50 mL of dichloromethane were introduced into a 100 mL three-neck flask under a nitrogen atmosphere, followed by stirring at room temperature. 1.14 g of 2,4-dimethylpyrrole was added dropwise while cooling with water, followed by addition of 5 drops of trifluoroacetic acid and then stirring at room temperature for 1 hour. While cooling with water, 2.72 g of 2,3-dichloro-5,6-dicyano-p-benzoquinone (DDQ) was added, followed by stirring at room temperature for 1 hour, and then 5.43 g of diisopropylethylamine ($N^iPr_2Et$) was added dropwise while cooling with water, followed by stirring at room temperature for 30 minutes. Subsequently, 8.29 mL of a boron trifluoride diethyl ether complex was added dropwise while cooling with water, followed by stirring at room temperature for 1 hour. 100 ml of distilled water was added thereto, and the organic layer obtained by extraction and liquid separation was predried over anhydrous sodium sulfate and then concentrated under reduced pressure. The resulting crude product was purified by silica gel column chromatography (developing solvent: hexane/ethyl acetate) and recrystallized from methanol to obtain 0.98 g of Compound (2-A).

2.44 g of Compound (2-A) and 60 mL of 1,1,1,3,3,3-hexafluoro-2-propanol were introduced into a 300 mL three-neck flask and stirred at room temperature. 3.60 g of N-iodosuccinimide (NIS) was introduced, followed by stirring at room temperature for 1 hour. After concentrating the reaction solution under reduced pressure, 50 mL of an aqueous sodium thiosulfate solution (in which 10 g of sodium thiosulfate was dissolved) and 100 mL of methylene chloride were added, and the organic layer obtained by extraction and liquid separation was predried over anhydrous sodium sulfate and then concentrated under reduced pressure. The resulting crude product was recrystallized from ethanol to obtain 3.12 g of Compound (3-A).

470 mg of Compound (3-A), 1000 mg of 2,4,6-trimethylphenylboronic acid, 1152.2 mg of cesium fluoride, and 26 mL of methoxycyclopentane were introduced into a 100 mL three-neck flask, followed by degassing under reduced pressure while stirring at room temperature, and then the reaction system was brought to a nitrogen atmosphere. 322 mg of SPhos Pd G3 (manufactured by Sigma-Aldrich Co. LLC.) was added thereto, followed by heating under reflux for 1 hour. 100 mL of saturated aqueous ammonium chloride solution and 100 mL of ethyl acetate were added, and the organic layer obtained by extraction and liquid separation was predried over anhydrous sodium sulfate and then concentrated under reduced pressure. The resulting crude product was purified by preparative TLC (developing solvent: hexane/ethyl acetate) and recrystallized from ethanol to obtain 308 mg of Compound (3-B).

60 mg of Compound (3-B), 59 mg of 2,4,6-trimethylbenzaldehyde, and 5 mL of dehydrated dimethylsulfoxide (DMF) were introduced into a 100 mL three-neck flask and stirred at room temperature. 300 μL of piperidine was introduced, followed by stirring at 140° C. for 3 hours. The crude product obtained by concentrating the reaction solution under reduced pressure was purified by silica gel column chromatography (developing solvent: hexane/ethyl acetate) and recrystallized from ethanol to obtain 20 mg of Compound (3). The compound was identified by ESI-MS. ESI-MS: $[M-H]^-=861$ Synthesis of Compound (1)

Compound (1) was synthesized in the same manner as in the synthesis of Compound (2), except that 2,4,6-trimethylbenzaldehyde at the synthesis of Compound (2-A) was replaced by 3,5-bis(trifluoromethyl)benzaldehyde, and 2,4,6-trimethylbenzaldehyde at the synthesis of Compound (2) was replaced by 2-methylbenzaldehyde. The compound was identified by ESI-MS. ESI-MS: $[M-H]^-=663$ Synthesis of Compound (4)

Compound (4) was synthesized in the same manner as in the synthesis of Compound (3), except that 2,4,6-trimethylbenzaldehyde at the synthesis of Compound (2-A) was replaced by 3,5-bis(trifluoromethyl)benzaldehyde, and 2,4,6-trimethylphenylboronic acid at the synthesis of Compound (3-B) was replaced by phenylboronic acid. The compound was identified by ESI-MS. ESI-MS: $[M-H]^-=871$ Synthesis of Compound (5)

Compound (5) was synthesized in the same manner as in the synthesis of Compound (3), except that 2,4,6-trimethylbenzaldehyde at the synthesis of Compound (2-A) was replaced by 3,5-bis(trifluoromethyl)benzaldehyde, and 2,4,6-trimethylphenylboronic acid at the synthesis of Compound (3-B) was replaced by 2,4-bis (trifluoromethyl)phenylboronic acid. The compound was identified by ESI-MS. ESI-MS: $[M-H]^-=1143$ Synthesis of Compound (6)

Compound (6) was synthesized in the same manner as in the synthesis of Compound (3), except that 2,4,6-trimethylbenzaldehyde at the synthesis of Compound (2-A) was replaced by 2,3,5,6-tetrafluorobenzaldehyde, and 2,4,6-trimethylphenylboronic acid at the synthesis of Compound (3-B) was replaced by 2,4-dimethylphenylboronic acid. The compound was identified by ESI-MS. ESI-MS: $[M-H]^-=863$ Synthesis of Compound (7)

Compound (7) was synthesized in the same manner as in the synthesis of Compound (3), except that 2,4,6-trimethylphenylboronic acid at the synthesis of Compound (3-B) was replaced by 2-fluorophenylboronic acid, and 2,4,6-trimethylbenzaldehyde at the synthesis of Compound (3) was replaced by 2,4,6-trimethoxybenzaldehyde. The compound was identified by ESI-MS. ESI-MS: $[M-H]^-=909$ Synthesis of Compound (8)

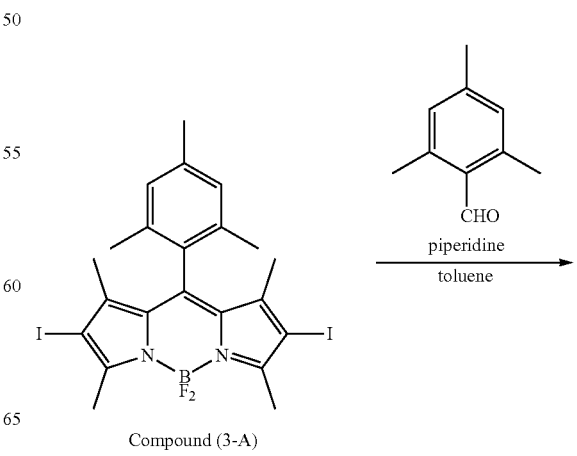

Compound (3-A)

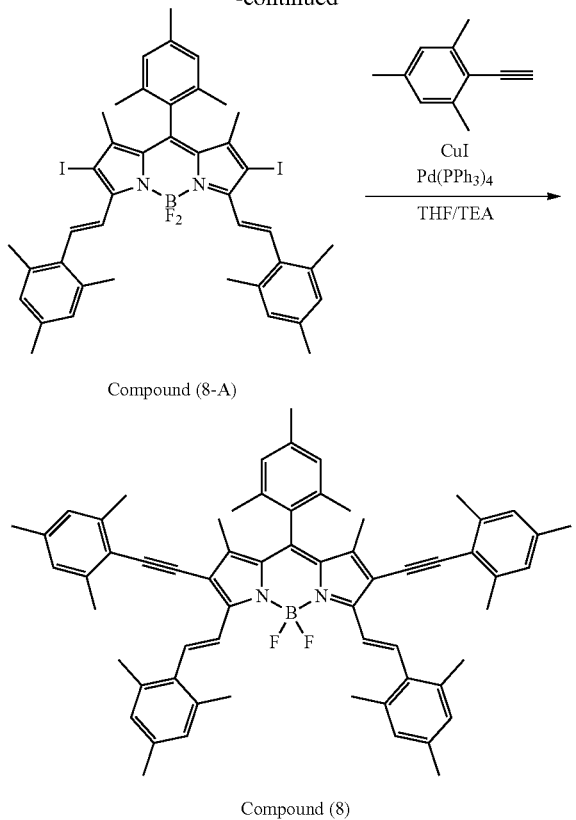

Compound (8-A)

Compound (8)

0.62 g of Compound (3-A), 0.59 g of 2,4,6-trimethylbenzaldehyde, and 50 mL of toluene were added to a 100 mL flask, and 5 mL of piperidine and one piece of paratoluenesulfonic acid were added thereto, followed by refluxing in an oil bath for 3 hours. The crude product obtained by concentrating the reaction solution under reduced pressure was purified by silica gel column chromatography (developing solvent: hexane/ethyl acetate) and then recrystallized from methanol to obtain 0.70 g of Compound (8-A).

88 mg of Compound (8-A), 58 mg of 2-ethynyl-1,3,5-trimethylbenzene, 3.8 mg of copper (I) iodide, 4 mL of tetrahydrofuran (THF), and 1 mL of triethylamine (TEA) were introduced into a 50 mL two-neck flask, followed by degassing under reduced pressure while stirring at room temperature, and then the reaction system was brought to a nitrogen atmosphere. Tetrakis(triphenylphosphine)palladium (0) (Pd(PPh$_3$)$_4$) was added thereto, followed by heating under reflux for 2 hours. The solvent was removed by distillation under reduced pressure, 30 mL of dichloromethane was added thereto, followed by washing with 20 mL of water and 20 mL of a saturated aqueous sodium chloride solution, and the organic layer was predried over anhydrous sodium sulfate and then concentrated under reduced pressure. The resulting crude product was purified by silica gel column chromatography (developing solvent: hexane/toluene) and then recrystallized from methanol to obtain 24 mg of Compound (8). The compound was identified by ESI-MS. ESI-MS: [M-H]$^-$=909

Synthesis of Compound (9)

Compound (9) was synthesized in the same manner as in the synthesis of Compound (3), except that 2,4,6-trimethylbenzaldehyde at the synthesis of Compound (2-A) was replaced by 2-methoxybenzaldehyde. The compound was identified by ESI-MS. ESI-MS: [M-H]$^-$=849

Synthesis of Compound (10)

Compound (10) was synthesized in the same manner as in the synthesis of Compound (2), except that 2,4,6-trimethylbenzaldehyde at the synthesis of Compound (2-A) was replaced by 2,3,5,6-tetrafluorobenzaldehyde, and 2,4-dimethylpyrrole was replaced by 3-ethyl-2,4-dimethylpyrrole. The compound was identified by ESI-MS. ESI-MS: [M-H]$^-$=719

Synthesis of Compound (11)

Compound (11) was synthesized in the same manner as in the synthesis of Compound (3), except that 2,4,6-trimethylbenzaldehyde at the synthesis of Compound (3) was replaced by 2,3,5,6-tetrafluorobenzaldehyde. The compound was identified by ESI-MS. ESI-MS: [M-H]$^-$=921

Synthesis of Compound (12)

Compound (12) was synthesized in the same manner as in the synthesis of Compound (3), except that 2,4,6-trimethylbenzaldehyde at the synthesis of Compound (2-A) was replaced by 2-fluorobenzaldehyde, 2,4,6-trimethylphenylboronic acid at the synthesis of Compound (3-B) was replaced by 2,4-difluorophenylboronic acid, and 2,4,6-trimethylbenzaldehyde at the synthesis of Compound (3) was replaced by 2,3,5,6-tetrafluorobenzaldehyde. The compound was identified by ESI-MS. ESI-MS: [M-H]$^-$=885

Synthesis of Compound (13)

100 mg of Compound (2) was weighed in a 50 mL flask and dissolved in 3 mL of methylene chloride. 64 mg of aluminum trichloride was added thereto, followed by heating under reflux for 30 minutes. Thereafter, the temperature of the reaction system was returned to room temperature, 1 mL of 1,1,1,3,3,3-hexafluoro-2-propanol was added, and the reaction was carried out for 30 minutes. The completion of the reaction was followed by concentration under reduced pressure. The resulting crude product was purified by silica gel column chromatography (developing solvent: hexane/ethyl acetate) and then recrystallized from methanol/methylene chloride to obtain 44 mg of Compound (13). The compound was identified by ESI-MS. ESI-MS: [M-H]$^-$=921

Synthesis of Compound (14)

138 mg of Compound (3) was weighed in a 50 mL flask and dissolved in 3 mL of methylene chloride. 64 mg of aluminum trichloride was added thereto, followed by heating under reflux for 30 minutes. Thereafter, the temperature of the reaction system was returned to room temperature, 1 mL of 2-ethylhexanol was added, and the reaction was carried out for 2 hours. The completion of the reaction was followed by concentration under reduced pressure. The resulting crude product was purified by silica gel column chromatography (developing solvent: hexane/ethyl acetate) to obtain 74 mg of Compound (14). The compound was identified by ESI-MS. ESI-MS: [M-H]$^-$=1081

Synthesis of Comparative Compound (1)

Comparative Compound (1) was synthesized in the same manner as in the synthesis of Compound (2), except that 2,4,6-trimethylbenzaldehyde at the synthesis of Compound (2-A) was replaced by triethyl orthoformate, 2,4-dimethylpyrrole was replaced by 2-methylpyrrole, and 2,4,6-trimethylbenzaldehyde at the synthesis of Compound (2) was replaced by benzaldehyde.

Synthesis of Comparative Compound (2)

Comparative Compound (2) was synthesized in the same manner as in the synthesis of Compound (1), except that 2-methylbenzaldehyde was replaced by 3-methylbenzaldehyde.

Synthesis of Comparative Compound (3)

Comparative Compound (3) was synthesized in the same manner as in the synthesis of Compound (1), except that 2-methylbenzaldehyde was replaced by 4-methylbenzaldehyde.

Example 3

1 g of polymethyl methacrylate (manufactured by Sigma-Aldrich Co. LLC.) was dissolved in 10 mL of toluene, then 10 mg of Compound (3) was added to prepare a coloring agent resin solution which was then spin-coated on a glass plate at 2000 rpm and dried on a hot plate at 50° C. to prepare a wavelength conversion luminescent resin composition (wavelength conversion member) (see paragraph [0081] of JP2011-241160A).

Example 4

1 g of liquid A and 1 g of liquid B of a silicone resin (KER-2500, two-component addition-cure silicone resin, manufactured by Shin-Etsu Chemical Co., Ltd.) were mixed and 20 mg of Compound (3) was added thereto, followed by mixing at 2000 rpm and defoaming at 2200 rpm with a planetary mixer (manufactured by Thinky Corporation, AWATORI RENTARO). The resulting coloring agent mixed liquid was coated on a glass plate and cured by heating on a hot plate at 60° C. for 2 hours and at 150° C. for 4 hours to prepare a wavelength conversion luminescent resin composition (wavelength conversion member).

Example 5

A wavelength conversion luminescent resin composition (wavelength conversion member) was prepared in the same manner as in Example 3, except that polymethyl methacrylate was replaced by polyvinyl chloride (manufactured by Sigma-Aldrich Co. LLC.).

Example 6

10 g of thermoplastic urethane (C80A, manufactured by BASF Corporation) and 100 mg of Compound (3) were added to a Laboplast Mill and melt-kneaded at 200° C. for 10 minutes. Thereafter, the kneaded resin was sandwiched between iron plates at 200° C., heated for 5 minutes, and pressed at 5 to 10 mPa while cooling (see paragraph [0213] of WO2015/056779A1). The wavelength conversion luminescent resin composition (wavelength conversion member) was prepared as described above.

Example 7

A wavelength conversion luminescent resin composition (wavelength conversion member) was prepared in the same manner as in Example 3, except that polymethyl methacrylate was replaced by polycarbonate (manufactured by Kanto Chemical Co., Ltd.).

Example 8

A wavelength conversion luminescent resin composition (wavelength conversion member) was prepared in the same manner as in Example 3, except that polymethyl methacrylate was replaced by triacetyl cellulose (manufactured by Wako Pure Chemical Industries, Ltd.), and toluene was replaced by methylene chloride.

Examples 1, 2, and 9 to 20 and Comparative Examples 1 to 3

In Examples 1, 2, and 9 to 20 and Comparative Examples 1 to 3, wavelength conversion luminescent resin compositions (wavelength conversion members) were prepared in the same manner as in Example 3, except that the compound used and the addition amount thereof were changed as shown in the following table.

Examples 21 and 22

In Examples 21 and 22, wavelength conversion luminescent resin compositions (wavelength conversion members) were prepared in the same manner as in Example 4, except that the compound used was changed as shown in the following table.

<Evaluation Method of Wavelength Conversion Member>

The prepared wavelength conversion luminescent resin composition (wavelength conversion member) was cut into 15 mm×15 mm and the quantum yield thereof was measured using an absolute PL quantum yield spectrometer C9920-02 (manufactured by Hamamatsu Photonics K.K.). The excitation wavelength was measured using a wavelength shorter than the maximum absorption wavelength of each compound by 50 nm. Evaluation standards for quantum yield are shown below.

S: 0.75 or more
A: 0.7 or more and less than 0.75
B: 0.6 or more and less than 0.7
C: 0.5 or more and less than 0.6
D: 0.4 or more and less than 0.5
E: less than 0.4

TABLE 1

|  | Compound | Addition amount (% by mass) | Resin | Quantum yield |
| --- | --- | --- | --- | --- |
| Example 1 | Compound (1) | 1 | PMMA | D |
| Example 2 | Compound (2) | 1 | PMMA | C |
| Example 3 | Compound (3) | 1 | PMMA | S |
| Example 4 | Compound (3) | 1 | Si resin | S |
| Example 5 | Compound (3) | 1 | PVC | S |
| Example 6 | Compound (3) | 1 | TPU | S |
| Example 7 | Compound (3) | 1 | PC | S |
| Example 8 | Compound (3) | 1 | TAC | S |
| Example 9 | Compound (3) | 0.1 | PMMA | S |
| Example 10 | Compound (3) | 0.01 | PMMA | S |
| Example 11 | Compound (3) | 20 | PMMA | A |
| Example 12 | Compound (4) | 1 | PMMA | C |
| Example 13 | Compound (5) | 1 | PMMA | C |
| Example 14 | Compound (6) | 1 | PMMA | A |
| Example 15 | Compound (7) | 1 | PMMA | A |
| Example 16 | Compound (8) | 1 | PMMA | C |
| Example 17 | Compound (9) | 1 | PMMA | B |
| Example 18 | Compound (10) | 1 | PMMA | D |
| Example 19 | Compound (11) | 1 | PMMA | S |
| Example 20 | Compound (12) | 1 | PMMA | B |
| Example 21 | Compound (13) | 1 | Si resin | C |
| Example 22 | Compound (14) | 1 | Si resin | S |
| Comparative Example 1 | Comparative Compound (1) | 1 | PMMA | E |
| Comparative Example 2 | Comparative Compound (2) | 1 | PMMA | E |
| Comparative Example 3 | Comparative Compound (3) | 1 | PMMA | E |

*Addition amount is % by mass with respect to the resin

It was demonstrated that the wavelength conversion luminescent resin compositions (wavelength conversion members) according to the embodiment of the present invention exhibit a higher quantum yield as compared with the wavelength conversion luminescent resin compositions (wavelength conversion members) of Comparative Examples.

What is claimed is:

1. A wavelength conversion luminescent resin composition, comprising:

at least one compound represented by Formula (1); and a resin,

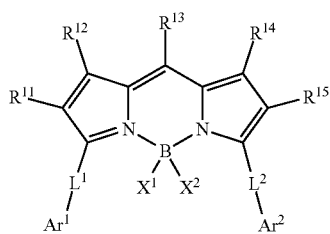

(1)

in the formula, $R^{11}$ and $R^{15}$ are each independently a substituent represented by Formula (Ar-1), $R^{12}$ and $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, $R^{13}$ is a substituent represented by Formula (Ar-1); $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-2),

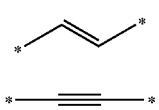

Formula (L-1)

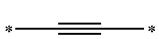

Formula (L-2)

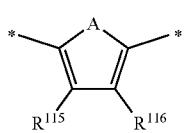

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—,

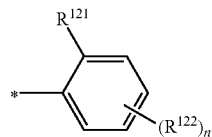

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another,

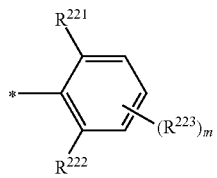

Formula (Ar-2)

in the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

2. A wavelength conversion luminescent resin composition, comprising:

at least one compound represented by Formula (1); and a resin,

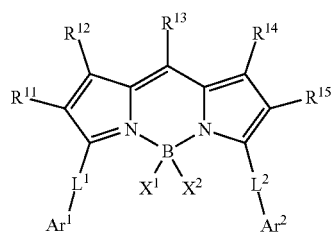

(1)

in the formula, $R^{11}$ and $R^{15}$ represent an aryl group which may have a substituent, $R^{12}$ to $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least one of $R^{12}$, $R^{13}$ and $R^{14}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1), Formula (L-1)

Formula (L-2)

Formula (L-3)

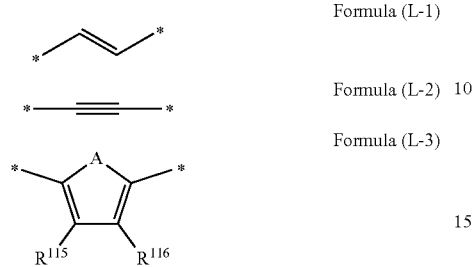

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—, Formula (Ar-1)

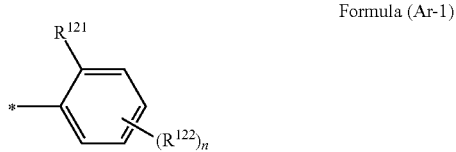

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

3. The wavelength conversion luminescent resin composition according to claim 1, wherein $L^1$ and $L^2$ are each independently a substituent represented by Formula (L-1) or Formula (L-2).

4. The wavelength conversion luminescent resin composition according to claim 1, wherein $R^{13}$ are each independently a substituent represented by Formula (Ar-2), Formula (Ar-2)

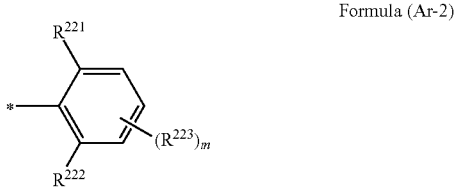

in the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

5. A wavelength conversion member comprising a wavelength conversion luminescent resin composition, comprising:
at least one compound represented by Formula (1); and a resin, (1)

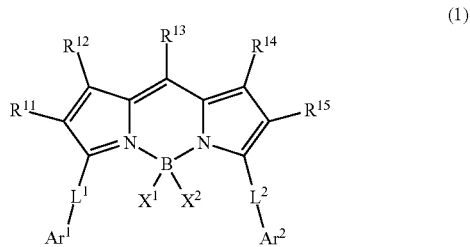

in the formula, $R^{11}$, $R^{12}$, $R^{14}$ and $R^{15}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, $R^{13}$ is a substituent represented by Formula (Ar-1), and at least two of $R^{11}$, $R^{12}$, $R^{14}$ and $R^{15}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-2), Formula (L-1)

Formula (L-2)

Formula (L-3)

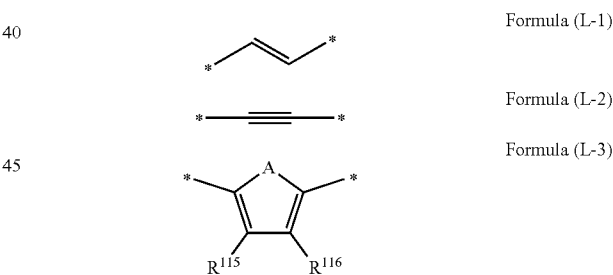

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—, Formula (Ar-1)

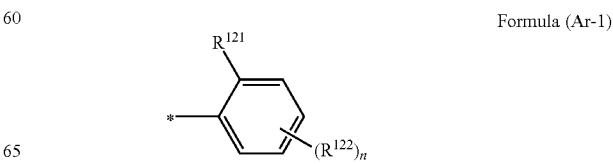

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another,

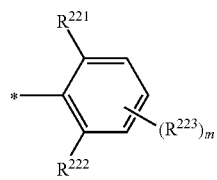

Formula (Ar-2)

in the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

6. A light-emitting element comprising the wavelength conversion member according to claim 5.

7. A method for producing a wavelength conversion luminescent resin composition, comprising:

a step of drying a solution containing at least one compound represented by Formula (1) and a resin in a solvent,

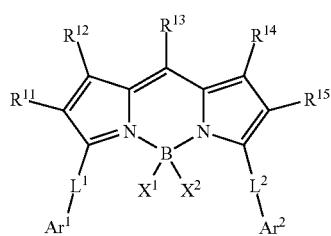

(1)

in the formula, $R^{11}$ and $R^{15}$ are each independently a substituent represented by Formula (Ar-1), $R^{12}$ and $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, $R^{13}$ is a substituent represented by Formula (Ar-1), $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-2),

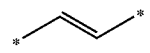

Formula (L-1)

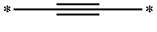

Formula (L-2)

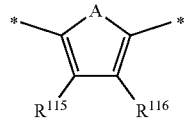

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—,

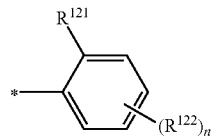

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another,

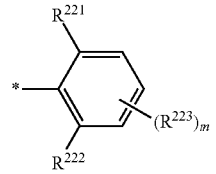

Formula (Ar-2)

in the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

8. A method for producing a wavelength conversion luminescent resin composition, comprising:

a step of curing a composition containing at least one compound represented by Formula (1) and a monomer and/or a polymerization precursor, (1)

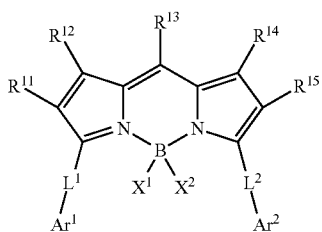

in the formula, $R^{11}$ and $R^{15}$ are each independently a substituent represented by Formula (Ar-1), $R^{12}$ and $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, $R^{13}$ is a substituent represented by Formula (Ar-1), $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-2), Formula (L-1)

Formula (L-2)

Formula (L-3)

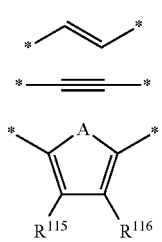

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—, Formula (Ar-1)

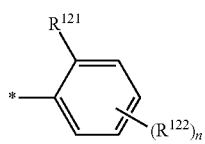

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another, Formula (Ar-2)

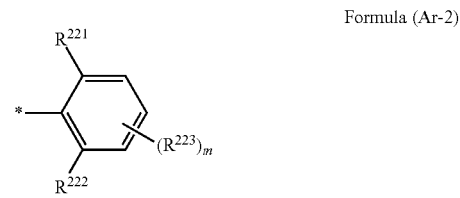

in the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

9. A method for producing a wavelength conversion luminescent resin composition, comprising:
a step of melting a composition containing at least one compound represented by Formula (1) and a resin, (1)

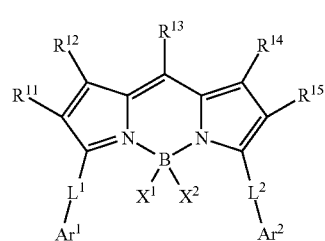

in the formula, $R^{11}$ and $R^{15}$ are each independently a substituent represented by Formula (Ar-1), $R^{12}$ and $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, $R^{13}$ is a substituent represented by Formula (Ar-1), $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-2), Formula (L-1)

Formula (L-2)

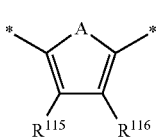

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—,

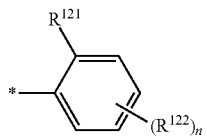

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another,

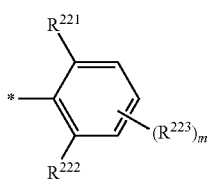

Formula (Ar-2)

in the formula, $R^{221}$, $R^{222}$, and $R^{223}$ each independently represent a halogen atom, an alkyl group, an amino group, a silyl group, an acyl group, an alkoxy group, an aryloxy group, an alkylthio group, or an arylthio group, each of which may have a substituent; and m represents an integer of 0 to 3, and in a case where m is 2 or more, a plurality of $R^{223}$'s may be the same as or different from one another.

10. A method for producing a wavelength conversion luminescent resin composition, comprising:

a step of drying a solution containing at least one compound represented by Formula (1) and a resin in a solvent,

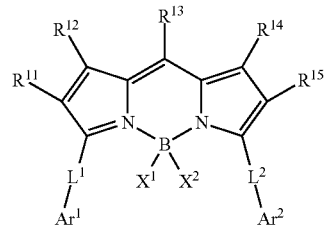

(1)

in the formula, $R^{11}$ and $R^{15}$ represent an aryl group which may have a substituent, $R^{12}$ to $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least one of $R^{12}$, $R^{13}$ and $R^{14}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1),

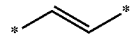

Formula (L-1)

Formula (L-2)

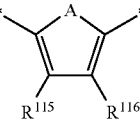

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—,

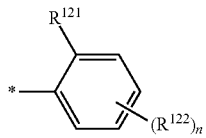

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

11. A method for producing a wavelength conversion luminescent resin composition, comprising:

a step of curing a composition containing at least one compound represented by Formula (1) and a monomer and/or a polymerization precursor,

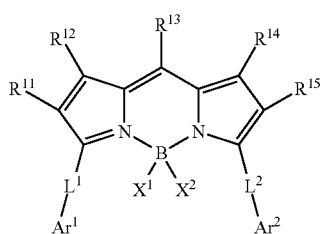
(1)

in the formula, $R^{11}$ and $R^{15}$ represent an aryl group which may have a substituent, $R^{12}$ to $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least one of $R^{12}$, $R^{13}$ and $R^{14}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1),

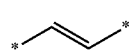
Formula (L-1)

Formula (L-2)

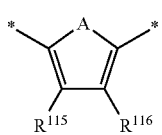
Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—,

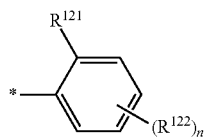
Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

12. A method for producing a wavelength conversion luminescent resin composition, comprising:

a step of melting a composition containing at least one compound represented by Formula (1) and a resin,

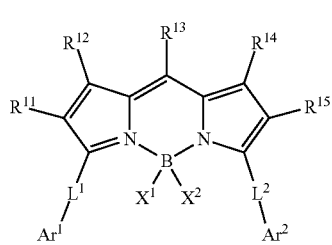
(1)

in the formula, $R^{11}$ and $R^{15}$ represent an aryl group which may have a substituent, $R^{12}$ to $R^{14}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent, and at least one of $R^{12}$, $R^{13}$ and $R^{14}$ represent atoms or groups other than hydrogen atoms; $X^1$ and $X^2$ each independently represent a halogen atom, an alkyl group, an aryl group, a heterocyclic group, a hydroxy group, an alkoxy group, an aryloxy group, an alkylthio group, an arylthio group, an ethenyl group, or an ethynyl group, each of which may have a substituent, and $X^1$ and $X^2$ may be linked to each other to form a ring; $L^1$ and $L^2$ each independently represent any one of Formula (L-1), Formula (L-2), or Formula (L-3); and $Ar^1$ and $Ar^2$ each independently represent Formula (Ar-1),

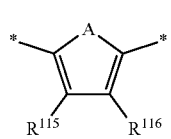
Formula (L-1)

Formula (L-2)

Formula (L-3)

in the formulae, $R^{115}$ and $R^{116}$ each independently represent a hydrogen atom, a halogen atom, an alkyl group, an aryl group, a heterocyclic group, an ethenyl group, an ethynyl group, an amino group, a silyl group, an acyl group, an alkoxy group, an aryloxy group, an alkylthio group, or an arylthio group, each of which may have a substituent; and A represents —O—, —S—, or —NH—,

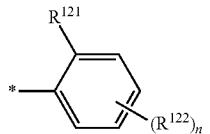

Formula (Ar-1)

in the formula, $R^{121}$ and $R^{122}$ each independently represent a halogen atom, an alkyl group, an amino group, a silyl group, an acyl group, an alkoxy group, an aryloxy group, an alkylthio group, or an arylthio group, each of which may have a substituent; and n represents an integer of 0 to 4, and in a case where n is 2 or more, a plurality of $R^{122}$'s may be the same as or different from one another.

* * * * *